US011759994B2

United States Patent
Shiode

(10) Patent No.: US 11,759,994 B2
(45) Date of Patent: Sep. 19, 2023

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 195 days.

(21) Appl. No.: 16/933,810

(22) Filed: Jul. 20, 2020

(65) Prior Publication Data

US 2021/0023768 A1 Jan. 28, 2021

(30) Foreign Application Priority Data

Jul. 24, 2019 (JP) ................................ 2019-136289
Nov. 8, 2019 (JP) ................................ 2019-203427

(51) Int. Cl.
| | |
|---|---|
| B29C 59/02 | (2006.01) |
| B29C 59/00 | (2006.01) |
| G03F 7/00 | (2006.01) |
| B29C 33/42 | (2006.01) |
| B29C 37/00 | (2006.01) |

(52) U.S. Cl.
CPC ............ B29C 59/02 (2013.01); B29C 33/424 (2013.01); B29C 59/002 (2013.01); G03F 7/0002 (2013.01); B29C 2037/90 (2013.01)

(58) Field of Classification Search
CPC ... B29C 59/02; B29C 59/002; B29C 2037/90; B29C 33/424; G03F 7/0002
See application file for complete search history.

(56) References Cited

U.S. PATENT DOCUMENTS

| | | | | |
|---|---|---|---|---|
| 2010/0052217 | A1* | 3/2010 | Kasumi ................. | G03F 7/0002 264/293 |
| 2010/0270705 | A1* | 10/2010 | Okushima ............. | B29C 59/002 264/293 |
| 2014/0367875 | A1* | 12/2014 | Shiode .................. | G03F 7/0002 425/150 |
| 2016/0257060 | A1* | 9/2016 | Ito ......................... | B29C 59/002 |
| 2017/0305043 | A1* | 10/2017 | Shiode .................. | G03F 7/0002 |
| 2020/0110333 | A1* | 4/2020 | Yoshida ................ | G03F 7/0002 |

FOREIGN PATENT DOCUMENTS

| | | |
|---|---|---|
| JP | 2010-056152 A | 3/2010 |
| JP | 2011-512019 A | 4/2011 |
| JP | 2017-199730 A | 11/2017 |

\* cited by examiner

*Primary Examiner* — Jerzi H Moreno Hernandez
(74) *Attorney, Agent, or Firm* — Canon U.S.A., Inc., IP Division

(57) ABSTRACT

An imprint apparatus for forming a pattern of an imprint material on a substrate using a mold, includes a mold holding unit including an actuator for moving mold, a force sensor detecting force generated by actuator, a position sensor measuring a position of mold, and a controlling unit controlling operation of mold holding unit. The controlling unit controls mold holding unit according to either a force imprint profile or a position imprint profile. The force imprint profile is for controlling movement of mold based on force generated by actuator and detected by force sensor. The position imprint profile is for controlling movement of mold based on position of mold measured by position sensor. When pattern of imprint material is formed on substrate, either force imprint profile or position imprint profile is selectable.

15 Claims, 19 Drawing Sheets

FIG. 8

| #Shot | DESIGNATED PROFILE |
|---|---|
| 1 | Z(1) |
| 2 | F(1) |
| 3 | F(1) |
| 4 | F(1) |
| ... | ... |
| j | Z(j) |
| ... | ... |
| 95 | F(j) |
| 96 | F(j) |

SHOT LAYOUT

FIG. 11
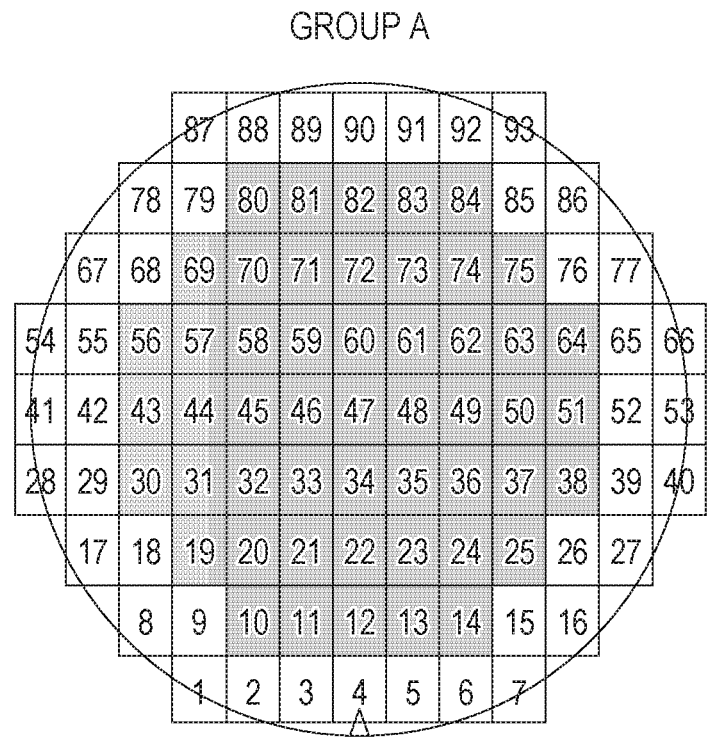
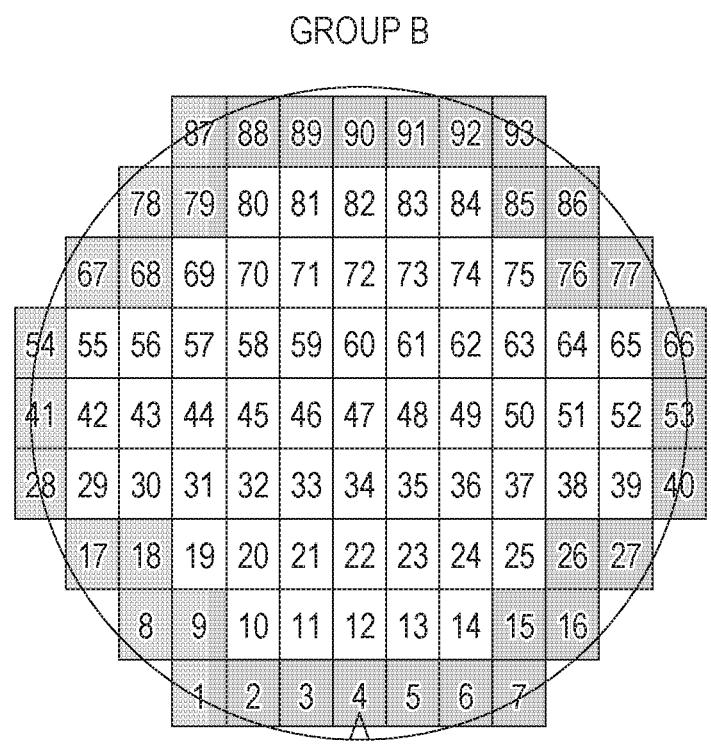

IMPRINT ORDER #1

IMPRINT ORDER #2

FIG. 14
GROUP A
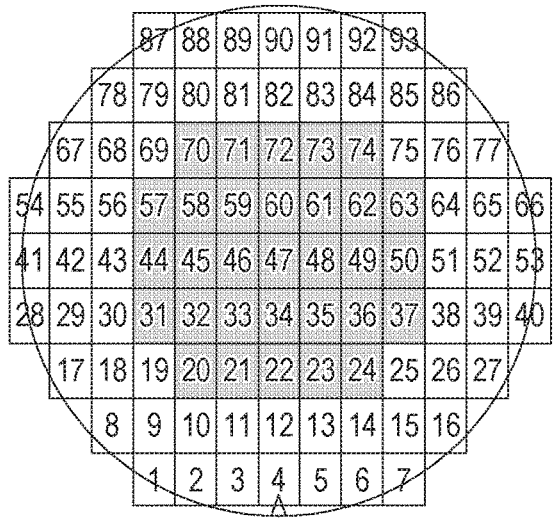
GROUP B
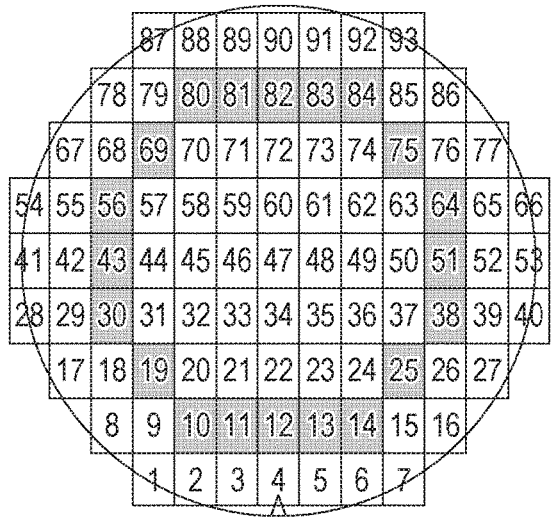
GROUP C
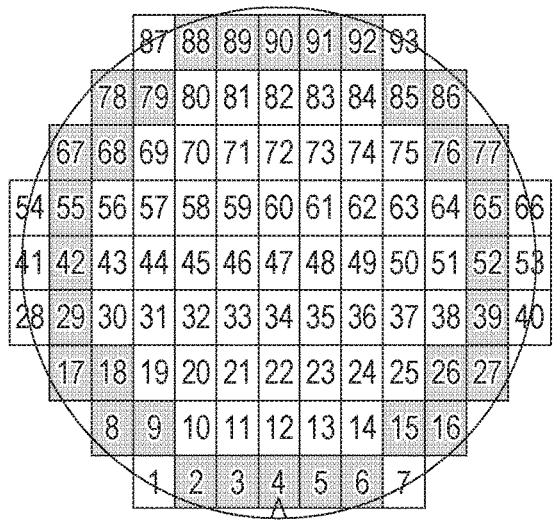
GROUP D
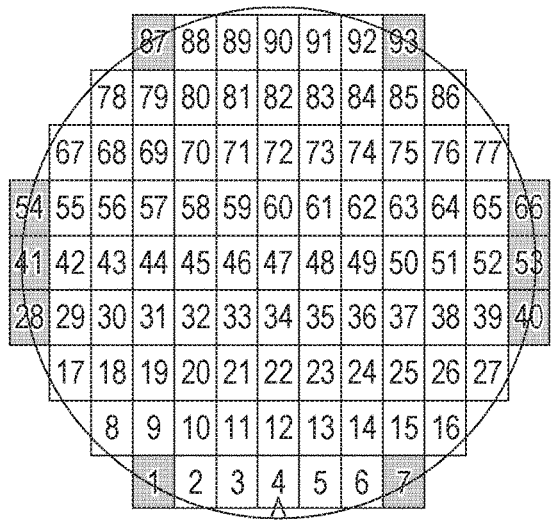

IMPRINT ORDER #3

| | | 87 | 88 | 89 | 90 | 91 | 92 | 93 | | |
| --- | --- | --- | --- | --- | --- | --- | --- | --- | --- | --- |
| | 78 | 79 | 80 | 81 | 82 | 83 | 84 | 85 | 86 | |
| | 67 | 68 | 69 | 70 | 71 | 72 | 73 | 74 | 75 | 76 | 77 |
| 54 | 55 | 56 | 57 | 58 | 59 | 60 | 61 | 62 | 63 | 64 | 65 | 66 |
| 41 | 42 | 43 | 44 | 45 | 46 | 47 | 48 | 49 | 50 | 51 | 52 | 53 |
| 28 | 29 | 30 | 31 | 32 | 33 | 34 | 35 | 36 | 37 | 38 | 39 | 40 |
| | 17 | 18 | 19 | 20 | 21 | 22 | 23 | 24 | 25 | 26 | 27 |
| | 8 | 9 | 10 | 11 | 12 | 13 | 14 | 15 | 16 | |
| | | 1 | 2 | 3 | 4 | 5 | 6 | 7 | | |

IMPRINT ORDER #4

| | | 87 | 88 | 89 | 90 | 91 | 92 | 93 | | |
| --- | --- | --- | --- | --- | --- | --- | --- | --- | --- | --- |
| | 78 | 79 | 80 | 81 | 82 | 83 | 84 | 85 | 86 | |
| | 67 | 68 | 69 | 70 | 71 | 72 | 73 | 74 | 75 | 76 | 77 |
| 54 | 55 | 56 | 57 | 58 | 59 | 60 | 61 | 62 | 63 | 64 | 65 | 66 |
| 41 | 42 | 43 | 44 | 45 | 46 | 47 | 48 | 49 | 50 | 51 | 52 | 53 |
| 28 | 29 | 30 | 31 | 32 | 33 | 34 | 35 | 36 | 37 | 38 | 39 | 40 |
| | 17 | 18 | 19 | 20 | 21 | 22 | 23 | 24 | 25 | 26 | 27 |
| | 9 | 10 | 11 | 12 | 13 | 14 | 15 | 16 | 1 | |
| | | 8 | 2 | 3 | 4 | 5 | 6 | 7 | | |

FIG. 18

| #Shot | Group | MEASUREMENT | DESIGNATED PROFILE | #Order |
|---|---|---|---|---|
| 1 | A | ○ | Z(1) | 1 |
| 2 | A |  | F(1) | 2 |
| 3 | A |  | F(1) | 3 |
| 4 | A |  | F(1) | 4 |
| ... |  |  | ... |  |
| j | B | ○ | Z(j) | m |
| ... |  |  | ... |  |
| 95 | B |  | F(j) | 92 |
| 96 | B |  | F(j) | 93 |

IMPRINT APPARATUS, IMPRINT METHOD, AND ARTICLE MANUFACTURING METHOD

BACKGROUND

Field of the Disclosure

The present disclosure relates to an imprint apparatus, an imprint method, and an article manufacturing method.

Description of the Related Art

Imprint method has been known as a method of manufacturing an article such as a semiconductor device, a MEMS, and the like. In this method, a pattern of an imprint material is formed on a substrate using a mold. In the imprint method, an imprint material is supplied onto a substrate, and the supplied imprint material and the mold are brought into contact with each other (imprinting). The imprint material is then cured while the imprint material and the mold are kept in contact with each other. The mold is then separated (released) from the cured imprint material. As a result, a pattern of the imprint material is formed on the substrate.

In the imprint method, if an air bubble remains in the pattern of the mold when the mold and the imprint material are brought into contact with each other, a defect may occur in the pattern formed on the imprint material. Bubbles may be prevented from remaining by increasing the time during which the mold and the imprint material are kept in contact with each other. However, this results in a reduction in the productivity of the imprint apparatus. Therefore, it is desirable to control the mold and the imprint material to be in contact with each other so as to suppress a defect from occurring in the pattern without reducing the productivity.

Japanese Patent Application Laid-Open No. 2011-512019 discloses a method of contacting a mold and a polymerizable material of a substrate with each other while controlling a height profile of the mold and the substrate so as to apply a predetermined force to the mold in the imprinting process. Japanese Patent Application Laid-Open No. 2017-199730 discloses a technique of contacting a mold and a substrate with each other in which a relative tilt between a mold and a substrate is corrected when imprinting is performed by controlling the relative tilt between the mold and the substrate such that a moment is within an allowable range.

In a case where a plurality of shot regions are formed on a substrate, an optimum imprint control parameter varies from one shot region to another depending on a location on the substrate. Therefore, it is not desirable to use the same control profile for all shot regions.

SUMMARY OF THE INVENTION

In view of the above, an imprint apparatus capable of setting an imprint control parameter suitable individually for each of a plurality of different shot regions on a substrate is provided.

In an aspect, the present disclosure provides an imprint apparatus configured to form a pattern of an imprint material on a substrate using a mold, including a mold holding unit including an actuator for moving the mold, a force sensor configured to detect force generated by the actuator, a position sensor configured to measure a position of the mold, and a controlling unit for controlling an operation of the mold holding unit, wherein the controlling unit controls the mold holding unit according to a force imprint profile or a position imprint profile, the force imprint profile being defined for controlling the movement of the mold based on force generated by the actuator and detected by the force sensor, the position imprint profile being defined for controlling the movement of the mold based on the position of the mold measured by the position sensor, and either the force imprint profile or the position imprint profile is selectable when the pattern of the imprint material is formed on the substrate.

Further features of the present invention will become apparent from the following description of exemplary embodiments with reference to the attached drawings.

BRIEF DESCRIPTION OF THE DRAWINGS

FIG. 8 is a diagram illustrating a preset imprint profile.

FIG. 11 is a diagram illustrating shot regions divided into groups according to the third embodiment.

FIG. 12 is a diagram illustrating a manner in which a representative shot region and an imprint order are set according to the third embodiment.

FIG. 13 is a diagram illustrating a manner in which a representative shot region and an imprint order are set according to the third embodiment.

FIG. 14 is a diagram illustrating shot regions divided into groups according to the third embodiment.

FIG. 15 is a diagram illustrating a manner in which a representative shot region and an imprint order are set according to the third embodiment.

FIG. 16 is a diagram illustrating a manner in which a representative shot region and an imprint order are set according to the third embodiment.

FIG. 18 is a diagram showing a setting example assigned to each shot region.

DESCRIPTION OF THE EMBODIMENTS

Figure 1:
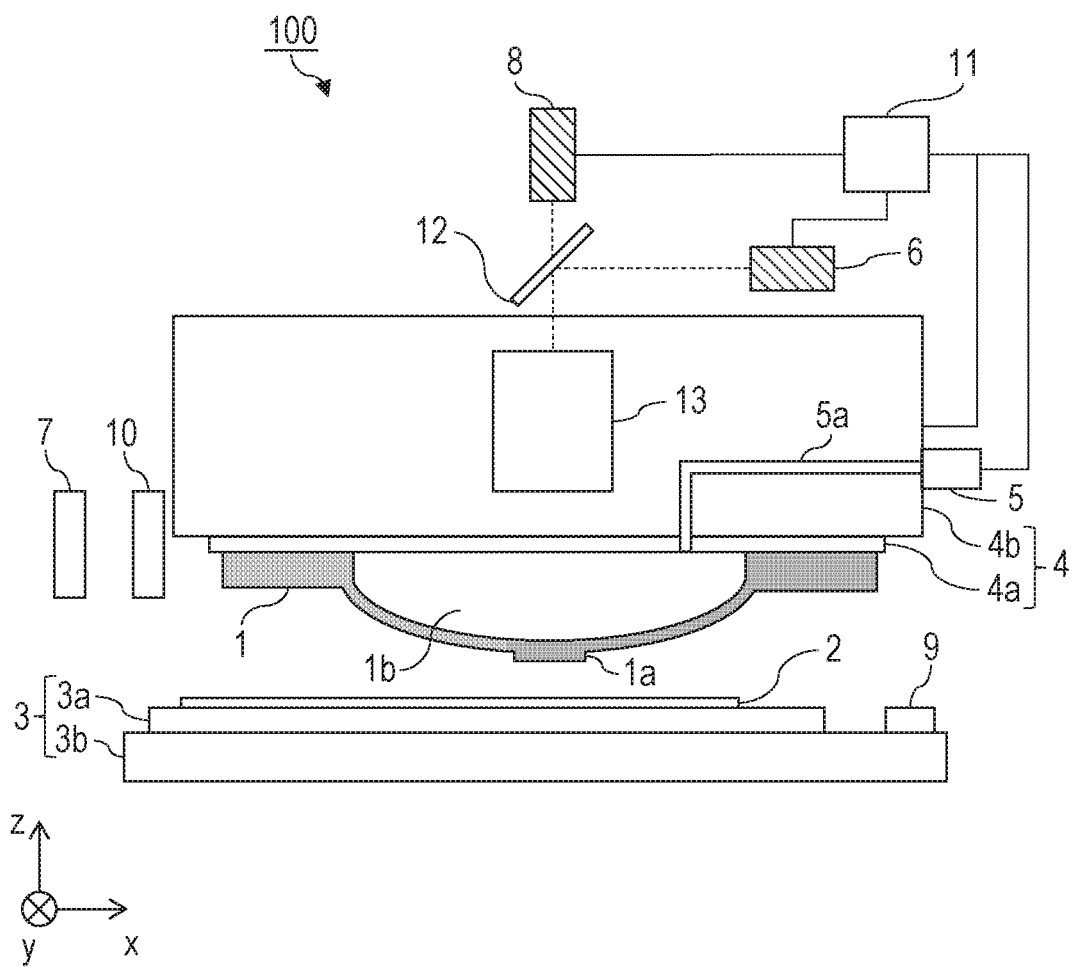
FIG. 1 is a schematic diagram illustrating an imprint apparatus according to a first embodiment.

Embodiments of the present invention are described in detail below with reference to accompanying drawings. In drawings, the same members are denoted by the same reference numerals, and duplicated descriptions thereof are omitted.

First Embodiment

An imprint apparatus 100 according to a first embodiment is described below. FIG. 1 is a schematic diagram illustrating a configuration of the imprint apparatus 100 according to the first embodiment. Referring to FIG. 1, the configuration of the imprint apparatus 100 is described below. Here, a surface on which a substrate 2 is placed is denoted as an XY plane, and a direction orthogonal to the XY plane is denoted as a Z direction (a height direction of the imprint apparatus 100), and these axes are defined as shown in FIG. 1.

The imprint apparatus 100 is an apparatus configured to form a cured pattern transferred from an uneven pattern of the mold by bringing a mold into contact with an imprint material supplied onto a substrate, and applying the curing energy to the imprint material. The imprint apparatus 100 is used for manufacturing a semiconductor device and the like by performing an imprinting process to form a pattern of an imprint material on the shot regions of the substrate 2 using a mold 1 having a pattern area 1a in which a pattern is formed. For example, the imprint apparatus 100 cures the imprint material while maintaining a state in which the pattern-formed mold 1 is in contact with the imprint material on the substrate 2. Thereafter, the imprint apparatus 100 moves the mold 1 apart from the substrate 2 thereby removing the mold 1 from the cured imprint material. As a result, the pattern of imprint material is formed on the substrate 2.

The imprint material may be cured by either a thermal cycle method using heat or a photo-curing method using light. In the present embodiment, by way of example, the photo-curing method is used. In the photo-curing method, an uncured ultraviolet curable resin is supplied as an imprint material onto the substrate 2, and the imprint material is irradiated with light (ultraviolet light) while the mold 1 and the imprint material are in contact with each other thereby curing the imprint material.

As for the imprint material, a curable composition (also referred to as an uncured resin), which can be cured by application of curing energy, is used. As for the curing energy, electromagnetic waves, heat, or the like is used. The electromagnetic waves used may be selected from those with wavelengths in the range from 10 nm to 1 mm Note that light such as infrared light, visible light, ultraviolet light, and the like may be employed as electromagnetic waves.

The curable composition is a composition that is cured when it is irradiated with light or when it is heated. Among these, the photocurable composition that is cured by light contains at least a polymerizable compound and a photopolymerization initiator, and may contain a non-polymerizable compound or a solvent as necessary. The non-polymerizable compound is at least one selected from the group including sensitizers, hydrogen donors, internal release agents, surfactants, antioxidants and polymer components.

The imprint material is applied, in a film form, to the substrate 2 using a spin coater or a slit coater. Alternatively, the imprint material may be applied onto the substrate 2, in the form of liquid drops, or in the form of islands or films formed by connecting a plurality of liquid drops, by a liquid spraying head. For example, the imprint material may have a viscosity in a range, for example, from 1 mPa·s to 100 mPa·s (at 25° C.).

[Imprint Apparatus]

Next, referring to FIG. 1, the configuration of the imprint apparatus 100 according to the first embodiment is described below. FIG. 1 is a schematic diagram illustrating the imprint apparatus 100 according to the first embodiment. The imprint apparatus 100 may include a substrate stage 3, an imprint head 4, a deforming unit 5, an irradiation unit 6, a supplying unit 7, an image capturing unit 8, a first measurement unit 9, a second measurement unit 10, and a controlling unit 11. Furthermore, the imprint apparatus 100 also includes a bridge surface plate for holding the imprint head 4, a base surface plate for holding the substrate stage 3, and the like.

The controlling unit 11 is formed, for example, using a computer including a CPU, a memory, and the like. The controlling unit 11 controls an imprinting process (by controlling various units of the imprint apparatus 100). The controlling unit 11 may be disposed in the imprint apparatus 100, or may be installed at a location different from the location of the imprint apparatus 100 to remotely control the imprint apparatus 100. The imprinting process may include a process (a contacting process) in which, for example, the pattern area 1a of the mold 1 is deformed by the deforming unit 5 such that the mold 1 and the imprint material on the substrate 2 starts to come into contact with each other, and a contact area between the mold 1 and the imprint material is gradually expanded.

The substrate stage 3 (the substrate holding unit) includes, for example, a substrate chuck 3a and a substrate driving unit 3b, and is configured to move while holding the substrate 2. The substrate chuck 3a holds the substrate 2 by, for example, vacuum suction force or electrostatic force. The substrate driving unit 3b mechanically holds the substrate chuck 3a and drives the substrate chuck 3a (the substrate 2) in XY directions. Furthermore, the substrate driving unit 3b may be configured to be capable of changing the position of the substrate 2 in the Z direction, the inclination of the substrate 2 with respect to the XY plane, and the rotation in the XY plane. As the material of the substrate 2, glass, ceramics, metal, semiconductor, resin, or the like is used. As necessary, a member made of a material different from the substrate 2 may be formed on the surface of the substrate 2. More specifically, the substrate 2 may be a silicon wafer, a compound semiconductor wafer, quartz glass, or the like. Furthermore, before the imprint material is applied, an adhesion layer for improving the adhesion between the imprint material and the substrate 2 may be formed, as necessary.

The imprint head 4 (the mold holding unit) includes, for example, a mold chuck 4a and a mold driving unit 4b, and is configured to move while holding the mold 1. The mold chuck 4a holds the mold 1 using, for example, vacuum suction force or electrostatic force. The mold driving unit 4b is configured to be capable of changing the position of the mold chuck 4a (the mold 1) in the Z direction and the inclination with respect to the XY plane. Furthermore, the mold driving unit 4b may be configured to be capable of also adjusting the position of the mold 1 in the XY directions.

In the present embodiment, the mold 1 and the imprint material on the substrate 2 are brought into contact with each other by driving the imprint head 4, but this is by way of example and not limitation. For example, the substrate stage 3 may be driven in the Z direction, or both the imprint head 4 and the substrate stage 3 may be driven simultaneously or sequentially.

The mold 1 held by the imprint head 4 is usually made of a material such as quartz capable of transmitting ultraviolet rays. The mold 1 has the pattern area 1a on the surface (the pattern surface) facing the substrate 2 wherein an uneven pattern to be transferred as a device pattern to the substrate 2 is formed in the pattern area 1a. The mold 1 may also be called a template or an original plate. The mold 1 has a rectangular outer shape. A mold-side mark that functions as an alignment mark is formed in the pattern area 1a of the mold 1. The pattern area 1a is formed in a mesa structure having a step with a height of, for example, about several tens of µm. The size of the pattern area 1a is typically 33 mm×26 mm, although the size of the pattern area 1a may vary depending on the device pattern to be transferred onto the substrate 2. In addition, the mold 1 has a cavity 1b (a recess) formed on a surface opposite to the pattern surface such that the provision of the cavity 1b causes the pattern area 1a and the part around the pattern area 1a to be thin, which makes it possible to easily deform the pattern area 1a. When the mold 1 is held by the imprint head 4 (mold chuck 4a), a substantially shielded space is formed in the cavity 1b. The cavity 1b is communicated with the deforming unit 5 via a pipe 5a.

Figure 2:
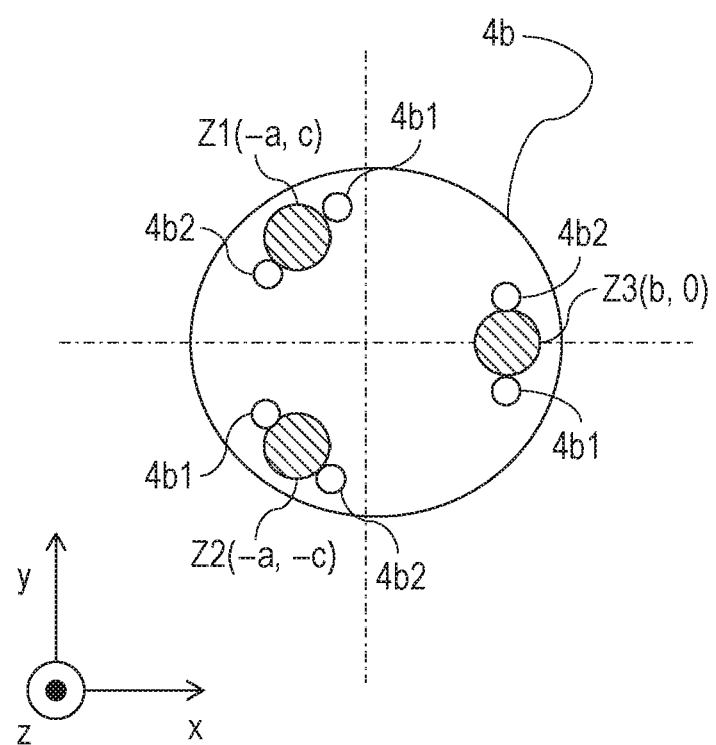
FIG. 2 is a diagram illustrating an imprint head of an imprint apparatus.

FIG. 2 is a diagram illustrating the imprint head 4 (mold driving unit 4b) viewed from the Z direction. Referring to FIG. 2, the configuration of the mold driving unit 4b is described below. The mold driving unit 4b includes, for example, a plurality of actuators Z1 to Z3 arranged as shown in FIG. 2. In this example, three actuators, that is, a first actuator Z1, a second actuator Z2, and a third actuator Z3 are provided in the mold driving unit 4b. By controlling each of the plurality of actuators, it is possible to change the relative position (in the Z direction) and relative tilts (in θX direction, and in θY direction) between the mold 1 and the substrate 2. Each of the actuators Z1 to Z3 may be provided with a position sensor 4b1 and a force sensor 4b2. The position sensor 4b1 detects the displacement amount of each of the actuators Z1 to Z3 and the displacement amount of the mold 1 by the plurality of actuators Z1 to Z3. The force sensor 4b2 detects force generated by each of the actuators Z1 to Z3 and force of pressing the mold 1 against the imprint material on the substrate 2 by the plurality of actuators Z1 to Z3.

The deforming unit 5 can change the pattern area 1a of the mold 1 into a convex shape or a concave shape with respect to the substrate 2 by changing the pressure in the inside of the cavity 1b of the mold 1 held by the imprint head 4. For example, to control the mold 1 and the substrate 2 so as to be brought close to each other such that the mold 1 and the imprint material on the substrate 2 are brought into contact with each other, the deforming unit 5 supplies compressed air into the inside of the cavity 1b via the pipe 5a such that the pressure inside the cavity 1b becomes higher than the pressure outside thereof. As a result, the deforming unit 5 deforms the pattern area 1a of the mold 1 into a convex shape protruding toward the substrate 2. Furthermore, in the contacting process, a contract area between the mold 1 and the imprint material gradually expands. By bringing the mold 1 and the imprint material into contact with each other in the above-described manner, it is possible to reduce the possibility that bubbles remain in recesses of the pattern area 1a (the uneven pattern) being in contact with the imprint material. Therefore, it is possible to reduce the occurrence of defects in the pattern formed on the imprint material via the imprinting process.

In a step of curing the imprint material on the substrate 2, the irradiation unit 6 irradiates the substrate 2 with light (ultraviolet light) for curing the imprint material. In the present embodiment, light emitted from the irradiation unit 6 is reflected by a beam splitter 12 (a band filter) and is applied to the substrate 2 via a relay optical system 13 and the mold 1.

The supplying unit 7 (dispenser) supplies (applies) the imprint material onto the substrate 2. In the imprint apparatus 100 according to the present embodiment, an ultraviolet curable resin, which is cured by irradiation with ultraviolet light, may be used as the imprint material. The supplying unit 7 may be disposed outside the imprint apparatus 100. In this case, the imprint material may be supplied onto the substrate 2 from the external supplying unit 7 in advance, and the supplied substrate 2 may be carried in the imprint apparatus 100.

The image capturing unit 8 captures an image of the pattern area 1a of the mold 1 via the beam splitter 12 and the relay optical system 13. For example, the image capturing unit 8 images the pattern area 1a at each of a plurality of timings when the contact area between the pattern area 1a of the mold 1 and the imprint material on the substrate 2 (shot region) is expanded in the contact step in which the mold 1 and the imprint material on the substrate 2 contact each other. The image capturing unit 8 is capable of capturing an image of interference fringes generated by a gap between the mold 1 and the substrate 2. Hence, based on images captured by the image capturing unit 8, it is possible to observe a manner in which the contact area between the pattern area 1a and the imprint material expands. Furthermore, to detect alignment marks respectively formed on the mold 1 and the substrate 2 (the shot region), an alignment scope (a detection system) may be provided.

The imprint apparatus 100 according to the present embodiment shown in FIG. 1 is configured such that the beam splitter 12 transmits the light from the image capturing unit 8 and reflects the light from the irradiation unit 6. However, the configuration is not limited to this example. For example, the irradiation unit 6 and the image capturing unit 8 may be replaced with each other. The first measurement unit 9 measures the height at a plurality of locations in the pattern field 1a (mold 1). The first measurement unit 9 may include a laser interferometer configured to, for example, irradiate the mold 1 with light and detect reflected light from an irradiated area on the pattern area 1a where the light is irradiated thereby measuring the height of the irradiated area (the distance between the first measurement unit 9 and the pattern area 1a). The first measurement unit 9 is installed on the substrate stage 3 such that the first measurement unit 9 moves in the XY directions together with the substrate stage 3 to scan the irradiated area on the mold 1 thereby measuring the heights at a plurality of positions in the pattern area 1a. Thus, it is possible to determine the shape and the tilt of the pattern area 1a. The first measurement unit 9 may be disposed on a stage different from the substrate stage 3 and may move in the XY directions separately from the substrate stage 3 to measure the height of the pattern area 1a.

The second measurement unit 10 measures heights at a plurality of locations on the substrate 2. The second measurement unit 10 may include a laser interferometer configured to, for example, irradiate the substrate 2 with light and detect reflected light from an irradiated area on the substrate 2 where the light is irradiated thereby measuring the height of the irradiated area (the distance between the second measurement unit 10 and the substrate 2). The second measurement unit 10 can measure the heights of a plurality of positions on the substrate 2 by scanning the irradiation region on the substrate 2 by moving the substrate 2 in the XY directions by the substrate stage 3. Thus, it is possible to determine the shape and the tilt of the substrate 2.

[Imprinting Process]

Figure 3:
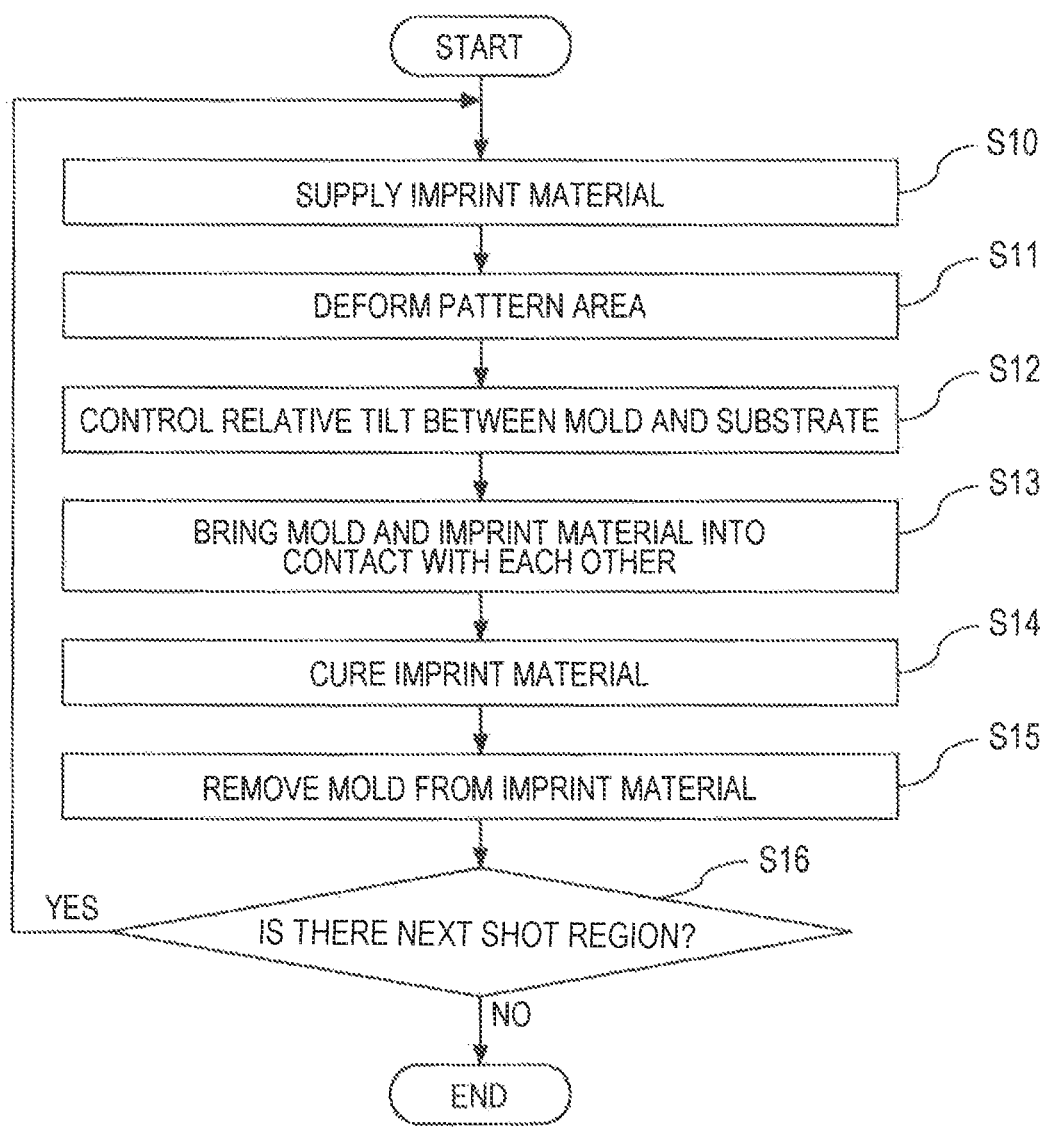
FIG. 3 is a flow chart illustrating an imprinting process according to the first embodiment.

Next, referring to FIG. 3, the imprinting process performed by the imprint apparatus 100 according to the first embodiment is described below. FIG. 3 is a flow chart illustrating a flow of the imprinting process. Each step in the imprinting process described below may be performed by the controlling unit 11.

When the imprinting process is started, in step S10, the controlling unit 11 controls the substrate stage 3 such that the shot region of the substrate 2 comes to a location below the supplying unit 7. Thereafter, the controlling unit 11 controls the supplying unit 7 to supply the imprint material to a particular shot region to be subjected to the imprinting process (a target shot region) among the plurality of shot regions formed on the substrate 2. After the imprint material is supplied to the target shot region, the controlling unit 11 controls the substrate stage 3 such that the target shot region is placed under the mold 1 (pattern area 1a).

In step S11, the controlling unit 11 controls the deforming unit 5 such that the pattern area 1a of the mold 1 is deformed into a convex shape protruding toward the substrate 2.

In step S12, the controlling unit 11 adjusts the relative tilt between the mold 1 and the substrate 2 such that the relative tilt between the mold 1 and the substrate 2 has a target value. More specifically, the relative tilt between the mold 1 and the substrate 2 is adjusted by changing the tilt of the mold 1 by driving the actuators provided in the mold driving unit 4b of the imprint head 4. Step S12 may be performed before step S11. In a case where the adjustment of the relative tilt between the mold 1 and the substrate 2 is not necessary, step S12 may be omitted.

In step S13, the controlling unit 11 controls the imprint head 4 such that the mold 1 and the substrate 2 approach each other in a state where the pattern area 1a is deformed by the deforming unit 5 and the mold 1 and the imprint material on the substrate 2 are brought into contact with each other (contacting step). For example, the controlling unit 11 performs controls to start the contacting between the mold 1 and the imprint material in a state in which the pattern area 1a is deformed by the deforming unit 5, and to gradually expand the contact area between the mold 1 and the imprint material.

In this step, the controlling unit 11 controls the contact between the mold 1 and the imprint material based on a time-dependent force command value (indicating a current value to be applied to drive the imprint head 4 in an up-and-down direction), which is called a force imprint profile. After the control of the contacting process based on the force imprint profile is started, the controlling unit 11 controls the deforming unit 5 such that the inner pressure of the cavity 1b gradually decreases as the contact area between the mold 1 and the imprint material expands. As a result, when the entire pattern area 1a comes into contact with the imprint material, the pattern area 1a has a plane shape. Alternatively, the controlling unit 11 may control the imprint head 4 such that the pattern area 1a and the surface of the substrate 2 come to be parallel to each other as the contact area between the mold 1 and the imprint material is expanded, thereby controlling the relative tilt between the mold 1 and the substrate 2.

In step S14, the controlling unit 11 controls the irradiation unit 6 to irradiate the imprint material with light while the pattern area 1a of the mold 1 and the imprint material are in contact with each other, thereby curing the imprint material.

In step S15, the controlling unit 11 controls the imprint head 4 such that the mold 1 is separated from the cured imprint material and the interval between the mold 1 and the substrate 2 is increased (mold separation step). In the mold separation step, the substrate stage 3 may be moved instead of moving the imprint head 4, or the interval between the mold 1 and the substrate 2 may be increased by controlling the substrate stage 3 and the imprint head 4. When this mold separation process is completed, a three-dimensional pattern of an imprint material corresponding to the pattern formed in the pattern area 1a is formed on the target shot region.

In step S16, the controlling unit 11 determines whether or not the substrate 2 has a further shot region (a next shot region) on which the pattern of the mold 1 is to be transferred. In a case where there is a next shot region (in a case where YES in step S16), the process returns to step S10. However, in a case where there is no next shot region (in a case where NO in step S16), the imprinting process ends. Thus, by performing the imprinting process shown in FIG. 3 in the above-described manner, it is possible to form the pattern of the imprint material in a plurality of shot regions on the substrate 2. Furthermore, by performing the imprinting process shown in FIG. 3 by a substrate-by-substrate basis, it is possible to form the pattern of the imprint material on a plurality of substrates.

[Force Control and Height Control]

In the imprint apparatus 100, when the mold 1 and the imprint material on the substrate 2 are brought into contact with each other, the controlling unit 11 controls the force applied by the imprint head 4. However, the controlling by the controlling unit 11 on the force applied by the imprint head 4 may be affected by a difference among specific apparatuses used as the imprint apparatus 100, a drift, a temperature change, or the like. Therefore, in a case where the imprinting process is performed using the force imprint profile that is normally used when the force by the imprint head 4 is controlled, there is a possibility that an actual imprinting force applied between the mold 1 and the substrate 2 is different from a specified value, which may affect a resultant formed pattern. For example, a filling property of the imprint material in the pattern area 1a, a protrusion of the imprint material from the pattern area 1a, and overlay performance deterioration may occur.

On the other hand, in the process in which the mold 1 and the imprint material on the substrate 2 are brought into contact with each other, the process may be controlled based on height. More specifically, the height of the mold 1 (the imprint head 4) is controlled based on a detection result by the position sensor 4b1 provided in the imprint head 4. When the contacting step in the imprinting process is executed by controlling the height, it is necessary that the distance between the mold 1 and the substrate 2 (the imprint material) and the shapes thereof are constant or known.

If the distance between the mold 1 and the substrate 2 is known to some extent, the contacting process may be performed as follows. First, the height control is performed to bring the mold 1 and the substrate 2 in are brought close each other until the mold 1 and the imprint material are nearly in contact with each other. Then they are brought into contact with each other, and force is controlled. In this processing, it is not necessary to measure the accurate distance between the mold 1 and the substrate 2, or it is not necessary to accurately measure the shapes of the mold 1 and the substrate 2. Thus, it is possible to perform the imprinting process repeatedly in a stable manner. In some cases, the substrates 2 supplied to the imprint apparatus 100 vary in height or shape from one substrate to another. To measure the height and shape of each of the plurality of substrates 2 individually from one substrate to another, it is necessary to measure many measurement points or areas, and it takes a lot of time before performing the imprinting process, which results in a reduction in productivity (throughput).

[Control Method According to the Invention]

Figure 4:
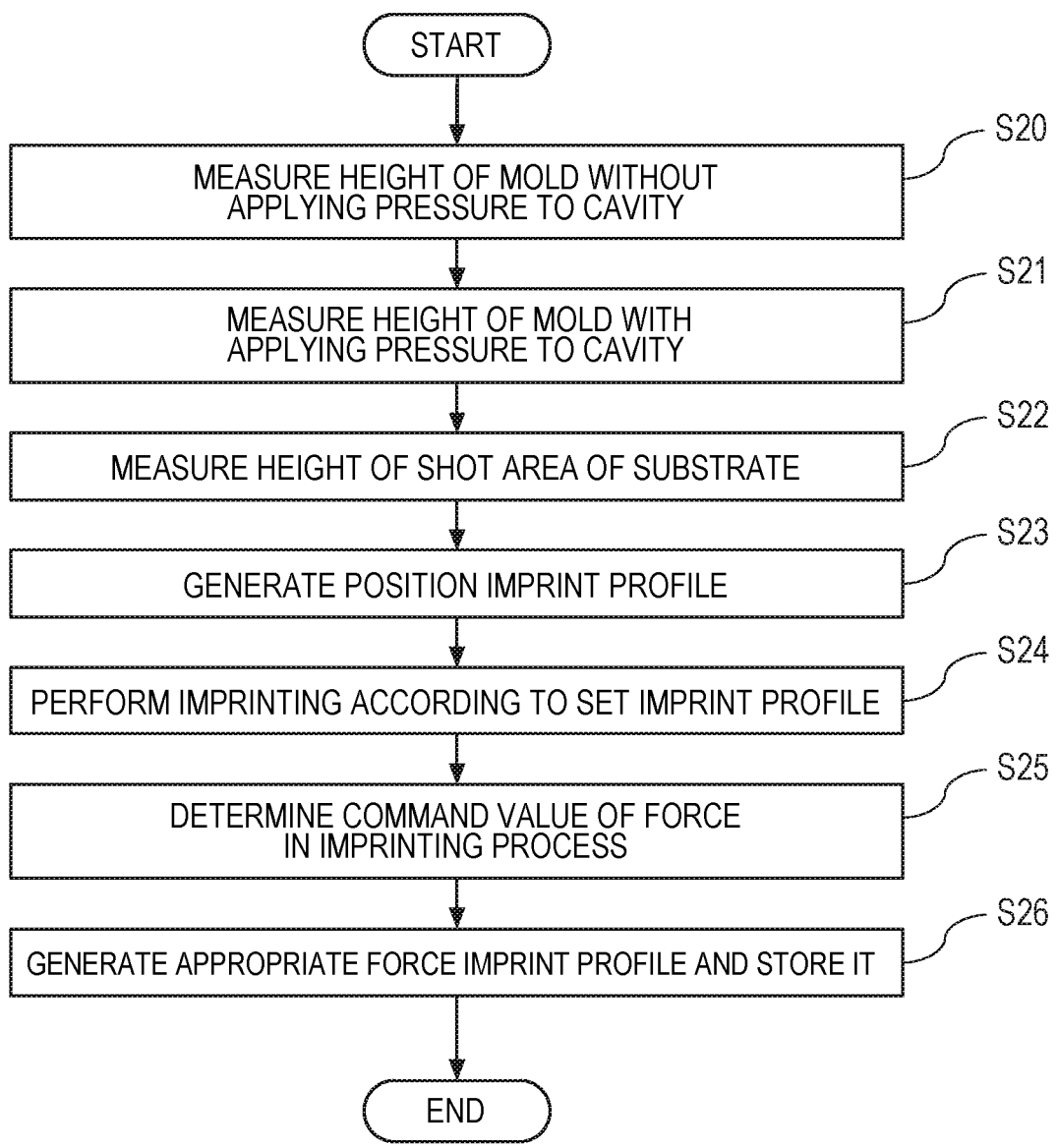
FIG. 4 is a diagram illustrating a flow of generating a position imprint profile and a force imprint profile according to the first embodiment.

In view of the above, the present invention provides a control method as described below. FIG. 4 is a flow chart illustrating a process of generating a force imprint profile used in the contacting process by the imprint apparatus 100 according to the present embodiment. Each step of this process may be performed by the controlling unit 11.

In step S20, the first measurement unit 9 measures the height of at least a central portion of the pattern area 1a in a state (0 state) in which no pressure is applied to the cavity 1b of the mold 1. The controlling unit 11 places the first measurement unit 9 under the mold 1 so as to make it possible for the first measurement unit 9 to measure the height of the pattern area 1a of the mold 1.

In step S21, the pressure applied to the cavity 1b of the mold 1 is set to be the same as the pressure applied in the imprinting process, and the set pressure is applied to the cavity 1b of the mold 1. In this state, the height of the central portion of the pattern area 1a or the height of its apex is measured by the first measurement unit 9. The controlling unit 11 places, as in step S20, the first measurement unit 9 under the mold 1 so as to make it possible for the first measurement unit 9 to measure the height of the pattern area 1a of the mold 1.

Then, in step S22, the second measurement unit 10 measures the height of the shot region of the substrate 2 carried on the substrate chuck 3a of the substrate stage 3. The controlling unit 11 places the second measurement unit 10 above the shot region of the substrate 2 so as to make it possible for the second measurement unit 10 to measure the height of the shot region of the substrate 2. As the height of the shot region, a result of measuring the height of the central portion of the shot region may be employed, or a result of measuring a plurality of points in the shot region may be employed.

In step S23, based on the height information determined in steps S20, S21, and S22, it is possible to generate an imprint profile which indicates a target position in a state in which the pattern area 1a and the imprint material on the shot region of the substrate 2 are in contact with each other. Furthermore, it is possible to generate an imprint profile Z(1) indicating a target height position at which the pattern area 1a is to be located in the state (0 state) in which no pressure is applied to the cavity 1b.

In step S24, the imprint profile obtained in step S23 is applied to a reference position imprint profile stored in advance in the controlling unit 11 to perform a control for an arbitrary given shot region so as to be at an appropriate height, and the imprinting step is performed. Thus, a pattern can be formed in a predetermined shot region according to the set position imprint profile.

In step S25, a time-dependent force command value issued in the imprinting process in step S24 according to the position imprint profile is determined in real time. In this way, it is possible to generate a force imprint profile F(1) for performing the imprinting process according to the position imprint profile indicating the optimum height. To determine the force command value in step S25, a command value of a current applied to the actuator of the mold driving unit 4b or the like is measured. The force imprint profile generated in step S24 for each shot region on the substrate 2 is stored in a storage unit in the controlling unit 11.

Figure 5:
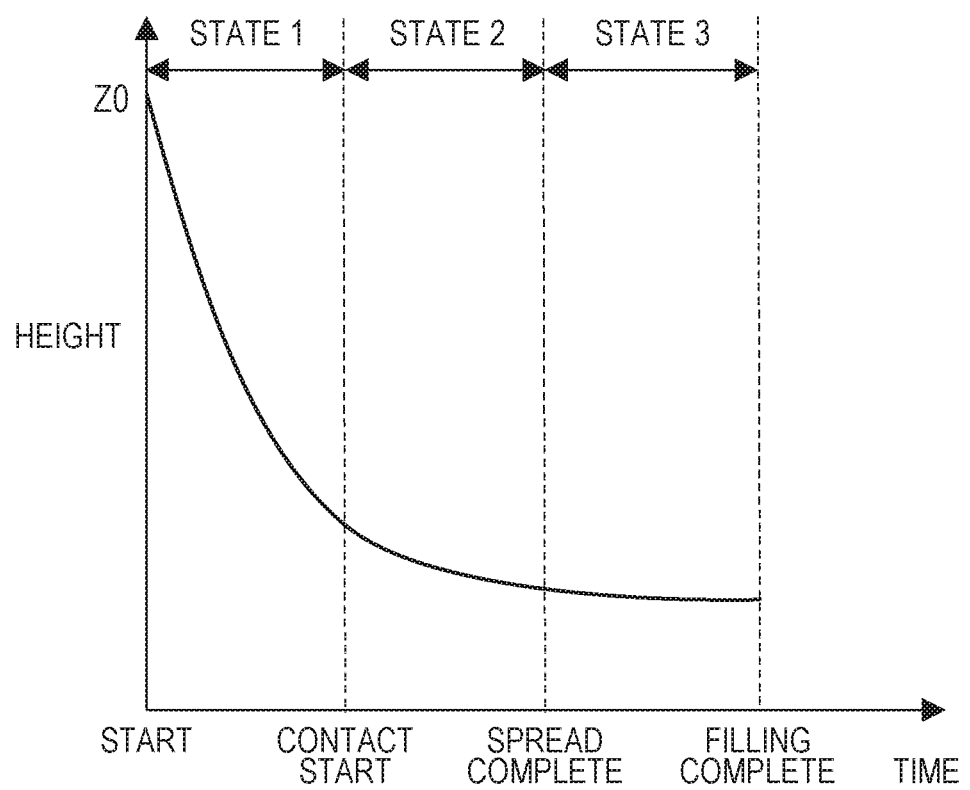
FIG. 5 is a diagram illustrating a position imprint profile according to the first embodiment.

FIG. 5 is a diagram illustrating the position imprint profile generated in step S23 in FIG. 4. In FIG. 5, a horizontal axis represents time from the start of the imprinting process until the imprint material is filled in the pattern area 1a (immediately before the curing step). A vertical axis represents the height of the pattern area 1a of the mold 1.

Figure 6:
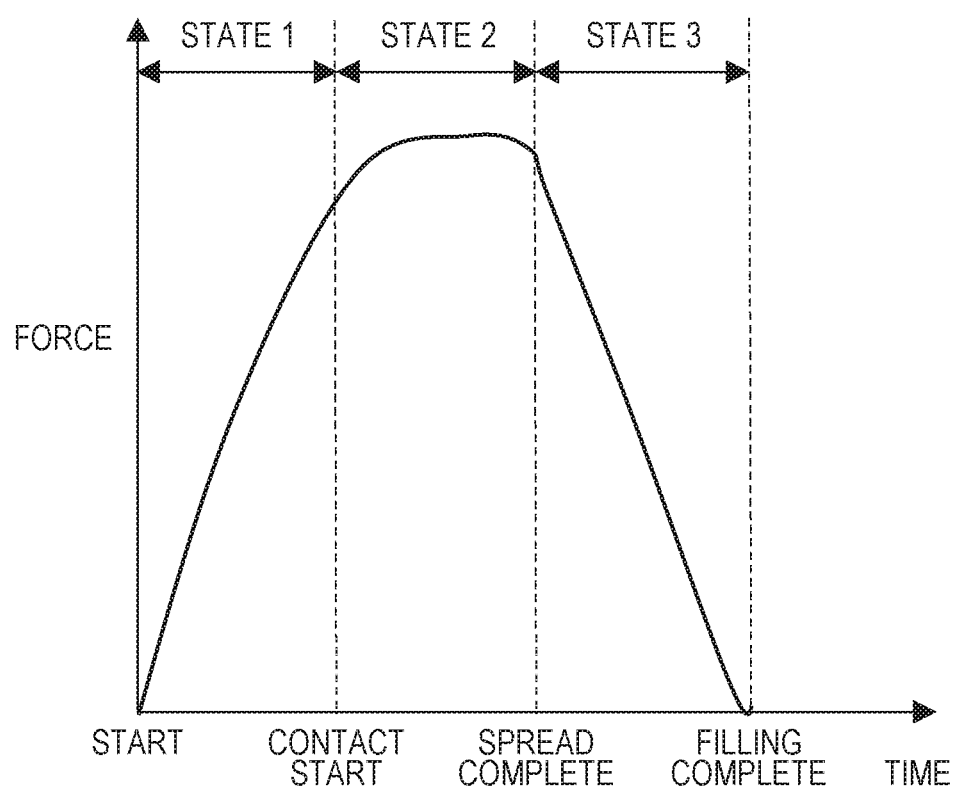
FIG. 6 is a diagram illustrating a force imprint profile according to the first embodiment.

FIG. 6 is a diagram illustrating the force imprint profile generated in step S26 in FIG. 4. A horizontal axis represents time from the start of the imprinting process until the imprint material is filled in the pattern area 1a (immediately before the curing process). A vertical axis represents force generated by the mold driving unit 4b in the imprinting process. As shown in FIG. 6, the force imprint profile in the imprinting process indicates that when the imprinting process starts, the force applied by the mold driving unit 4b increases (state 1). When the mold 1 and the imprint material on the substrate 2 are actually brought into contact with each other, a constant force is applied by the mold driving unit 4b (state 2). When the spread is completed, then in the following period until the filling is completed, the applied force is gradually reduced (state 3).

A basic system flow has been described above for determining the position imprint profile and the force imprint profile in the imprinting step in the imprinting process according to the first embodiment. This basic system flow makes it possible to reduce the influence that would otherwise occur in the imprinting process based on the conventional force control in the imprint apparatus 100 due to a machine difference, a drift, a temperature change, or the like. For example, it is possible to reduce the influence on the filling property of the imprint material in the pattern area 1a, the protrusion of the imprint material from the pattern area 1a, and overlay performance deterioration. This is because the imprint profile can be updated each time the imprinting process is performed for each of a plurality of shots. As a result, it is possible to determine a force imprint profile corresponding to the preset basic position imprint profile, and it becomes possible to select a position imprint profile or a force imprint profile for each of a plurality of shot regions formed on the substrate 2. Similarly, it becomes possible to determine a position imprint profile corresponding to the preset basic force imprint profile, and it becomes possible to select a force imprint profile or a position imprint profile for each of the plurality of shot regions formed on the substrate 2.

Figure 7:
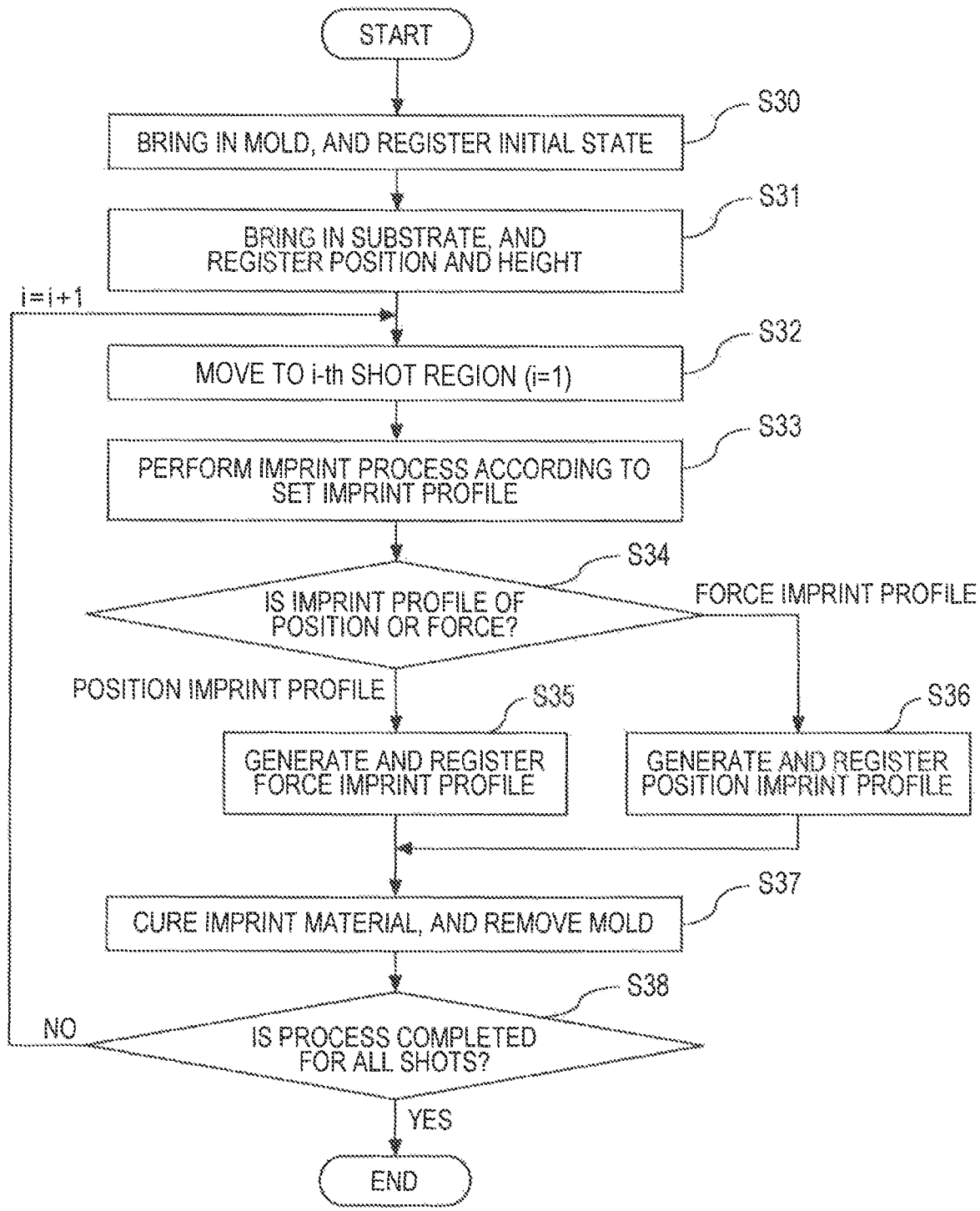
FIG. 7 is a diagram illustrating a flow of generating an imprint profile according to the first embodiment.

Next, referring to a flow chart shown in FIG. 7, the throughput, which is the other concern, is described below with reference to an actual imprinting process. FIG. 7 is a flow chart illustrating a method of generating an imprint profile when a pattern is formed in a plurality of shot regions on the substrate 2.

When the imprinting process is started, in step S30, the mold 1 is carried in the imprint apparatus 100. When the mold 1 is carried in the imprint apparatus 100, the height of the mold 1 is measured via the procedure described above, and the initial state of the mold 1 is registered.

Next, in step S31, the substrate 2 is carried in the imprint apparatus 100. When the substrate 2 is carried in the imprint apparatus 100, a process is performed to measure the layout of a plurality of shot regions formed on the substrate 2 and register the result as layout information (position information). Normally, in the registration sequence, alignment marks of two or more shots are measured and position information is registered. When the position of the alignment mark is measured, the height of the target shot region is measured and the height information is registered together with the position information. In the present embodiment, among the plurality of shot regions formed on the substrate 2, a first shot region subjected first to the imprinting process is measured and a measurement result may be added as position information and height information.

After the position information and the height information on the substrate 2 are registered in step S31, then in step S32, the substrate 2 is moved by the substrate stage 3 such that the first shot region is located at an imprint position (below the pattern area 1a).

In step S33, the imprinting process is performed according to the imprint profile preset for each shot region. The imprint profile preset for each of the plurality of shot regions formed on the substrate 2 may be designated on a console screen (a displaying apparatus) of the imprint apparatus as shown in FIG. 8. FIG. 8 illustrates imprint profiles designated for respective shot regions on the substrate 2. A predetermined imprint profile may be set for a shot region on the setting screen. In the present example, the imprinting process on the first shot region (#Shot1) is performed according to the position imprint profile (Z(1)).

In step S34, it is determined whether a position imprint profile or a force imprint profile is used in the imprinting process. The subsequent steps differ depending on the used imprint profile. In a case where it is determined in step S34 that a position imprint profile is used in the imprinting process, then in step S35, force information for a target shot region is measured when the imprinting process is performed according to the position imprint profile, and a force imprint profile is generated and registered. On the other hand, in a case where it is determined in step S34 that a force imprint profile is used in the imprinting process, then in S36, height information for the target shot region is measured when the imprinting process is performed according to the force imprint profile, and a position imprint profile is generated and registered.

In the example of setting of imprint profiles shown in FIG. 8, a position imprint profile Z(1) is set for the first shot region. The position imprint profile Z(1) for the first shot region is corrected to be suitable for the first shot region via the basic system flow described above, and the imprinting process is executed according to the corrected position imprint profile. As described above, in step S34, when imprinting using a position imprint profile is executed, force information for the first shot region is acquired and force imprint profile F(1) is generated and registered in step S35.

After the imprinting process is executed according to the imprint profile set for each shot region to fill the pattern area 1a with the imprint material, the imprint material is cured in step S37. A mold separation step is then executed to separate the mold 1 from the cured imprint material.

If the curing of the imprint material and the separation of the mold are performed in step S37, in step S38, a determination is made as to whether among the plurality of shot regions on the substrate 2, there is a shot region that has not yet been subjected to the imprinting process. For example, when the imprinting process on the first shot region is completed, the processing flow returns to step S32 to perform the imprinting process on a second shot region. That is, the imprinting process is executed on the second shot region according to an imprint profile preset for the second shot region.

In this example, a force imprint profile F(1) is set in advance for the second shot region, and thus the imprinting process is executed according to the force imprint profile F(1) generated when the imprinting is executed on the previous shot region (the first shot region). The imprint apparatus 100 has a reference force imprint profile stored therein in advance. In this case, the height of the second shot region has not been measured. Therefore, height information approximated by an approximation plane or curved surface of the shot region is predicted based on the registered height information acquired by actually measuring the height of the substrate 2 when the substrate 2 is carried in the imprint apparatus 100. The height of the imprint head 4 is adjusted to a certain degree by issuing a target height instruction to the imprint head 4 based on the predicted height information, and the pattern area 1a is placed so as to oppose the second shot region. Thereafter, the imprinting operation is performed according to the force imprint profile F(1). As described above, in a case where it is determined in step S34 that a force imprint profile is used in the imprinting process, then, in step S36, height information on the second shot region is measured when the imprinting process is performed according to the force imprint profile in step S34, and a position imprint profile Z(2) is generated and registered.

As described above, the imprinting process suitable for each of the plurality of shot regions formed on the substrate 2 can be performed by performing the imprinting process depending on the shot region and according to the profile designated for the shot region defined for each shot region in the substrate registration process. This makes it possible to execute a stable imprinting process on a plurality of shot regions without reducing productivity (throughput).

Second Embodiment

In a second embodiment disclosed below, a tilt control is performed in the imprinting process in addition to controls disclosed in the first embodiment. A description of contents overlapping with those already described in the first embodiment will be omitted, and the tilt control which is a feature of the second embodiment will be described.

Figure 9:
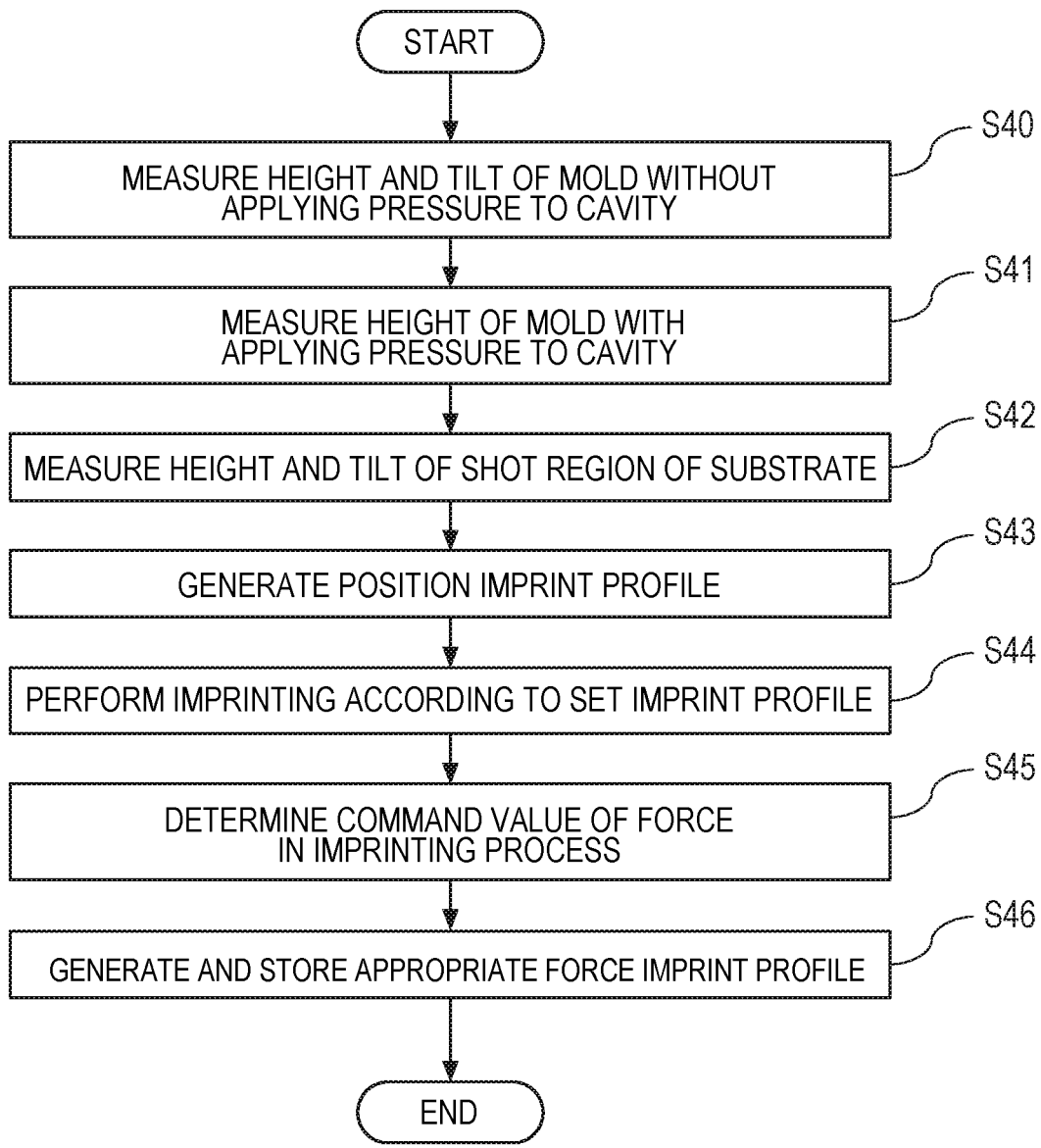
FIG. 9 is a diagram illustrating a flow of generating a position imprint profile and a force imprint profile according to a second embodiment.

FIG. 9 is a flow chart illustrating a process of generating an imprint profile taking into account the tilt control according to the second embodiment. Each step of this process described below may be performed by the controlling unit 11.

In step S40, as with the method of generating a basic imprint profile described above with reference to FIG. 4, the first measurement unit 9 measures the height of a central portion of the pattern area 1a and the tilt of the pattern area 1a in a state (0 state) where no pressure is applied to the cavity 1b of the mold 1. The controlling unit 11 places the first measurement unit 9 under the mold 1 such that the first measurement unit 9 is capable of measuring the height and the tilt of the pattern region 1a of the mold 1. The tilt of the pattern area 1a can be measured by performing the measurement at a plurality of locations in the pattern area 1a using the first measurement unit 9.

In step S41, a pressure is applied to the cavity 1b of the mold 1 such that the pressure is the same as the pressure actually employed in the imprinting process, and the height of the central portion of the pattern area 1a or the height of its apex is measured by the first measurement unit 9. The controlling unit 11 places, as in step S40, the first measurement unit 9 under the mold 1 such that the first measurement unit 9 is capable of measuring the height of the pattern region 1a of the mold 1.

Subsequently, in step S42, for the substrate 2 loaded on the substrate chuck 3a of the substrate stage 3, the second measurement unit 10 measures the height of a specific shot region of the substrate 2 and the tilt thereof within the shot region. The controlling unit 11 places the second measurement unit 10 above the shot region of the substrate 2 such that the second measurement unit 10 is capable of measuring the height of the shot region of the substrate 2. As the height of the shot region, the result of measuring the height of the central portion of the shot region may be used, or the height of the shot region may be determined from a result of measuring the height at a plurality of locations in the shot region. The tilt of the shot region may be measured by performing the measurement the height at a plurality of locations in the shot region using the second measurement unit 10.

In step S43, an imprint profile is generated based on the height information and the tilt information determined in steps S40, S41, and S42 such that the imprint profile indicates a target height position and a target tilt in a state in which the pattern area 1*a* and the imprint material on the shot region of the substrate 2 are in contact with each other. The controlling unit 11 generates an appropriate position imprint profile from the height information and the tilt information of the mold 1 and the shot region stored in advance as position imprint profile, and stores the generated position imprint profile. Here, the target tilt indicates a relative tilt between the specific shot region and the pattern area 1*a*. The target tilt is tilt information necessary in controlling the tilt of the mold 1 in the imprinting process. As for the imprint profile generated in step S43, an imprint profile Z(1) may be generated which indicates the target height position of the pattern area 1*a* in the state (0 state) where no pressure is applied to the cavity 1*b*.

Furthermore, the target height position and the target tilt may be specified in the state (0 state) in which no pressure is applied to the cavity 1*b*. These pieces of information are applied to position imprint profiles Z1(1), Z2(1), and Z3(1), for use in controlling the respective three-axis actuators, stored in advance in the controlling unit 11 of the imprint apparatus 100. According to these pieces of information, the height and the tilt indicated in the position imprint profile for each three-axis actuator are corrected such that the height and the tilt become suitable for any shot region, and resultant position imprint profiles are stored.

In step S44, the imprint profiles obtained in step S43 are applied to the position imprint profiles stored in the controlling unit 11, and thereby the imprinting process is executed such that the height is adequately controlled for an arbitrary given shot region. In this way, a pattern can be formed in a predetermined shot region according to the set position imprint profile. Thus, the corrected position imprint profiles for the respective 3-axis actuators are employed as execution profiles when imprinting is performed in an arbitrary given shot region.

In step S45, a time-dependent force (current) command value issued in the imprinting process in step S44 according to the position imprint profile is determined in real time for each of the 3-axis actuators. In this way, it is possible to generate an appropriate force imprint profile F(1) when the imprinting process is performed according to the position imprint profile that controls the optimum height. As the force command value determined in S45, the command value of the current of the actuator of the mold driving unit 4*b* is measured.

In step S46, the force imprint profiles F1(1), F2(1), and F3(1), for controlling the respective 3-axis actuators, generated as described above by measuring the force command values during the imprinting process performed according to the position imprint profile are stored. In step S44, a force imprint profile may be generated for each shot region on the substrate 2, and may be stored in the storage unit of the controlling unit 11.

The basic system flow has been described above in which the target tilt determined by the three axis heights is converted to a balance among three-axis forces, that is a moment. The conversion of the target tilt into the moment may not be performed. In this case, a force imprint profile may be generated from the sum of forces by the three axis actuators, and the tilt control may be performed according to tilt profiles Z1(1), Z2(1), and Z3(1). Although in the present example, three axis actuators are used to move the mold 1, the number of actuators is not limited to three, but an arbitrary number of actuators may be used.

When the imprinting process is executed while controlling the moment according to force imprint profiles F1(1), F2(1), and F3(1), height information relating to the 3-axis actuators may be measured, and a tilt control profile may be generated based on the measurement result.

The above-described system flow of the imprint apparatus 100 makes it possible to reduce the possibility that the tilt is influenced by a machine difference of the imprint apparatus 100, a drift, a temperature change, which may occur during the imprinting process based on the force control. Based on the relative tilt information between the mold 1 and an arbitrary shot region of the substrate 2, it is possible to correct or eliminate a 3-axis moment error. As described above, also in the imprint method according to the second embodiment, by performing the imprinting process depending on the shot region and the profile designated for the shot region defined for each shot region in the substrate registration process, it is possible to perform a stable imprinting process without causing a reduction in throughput.

Third Embodiment

Figure 10:
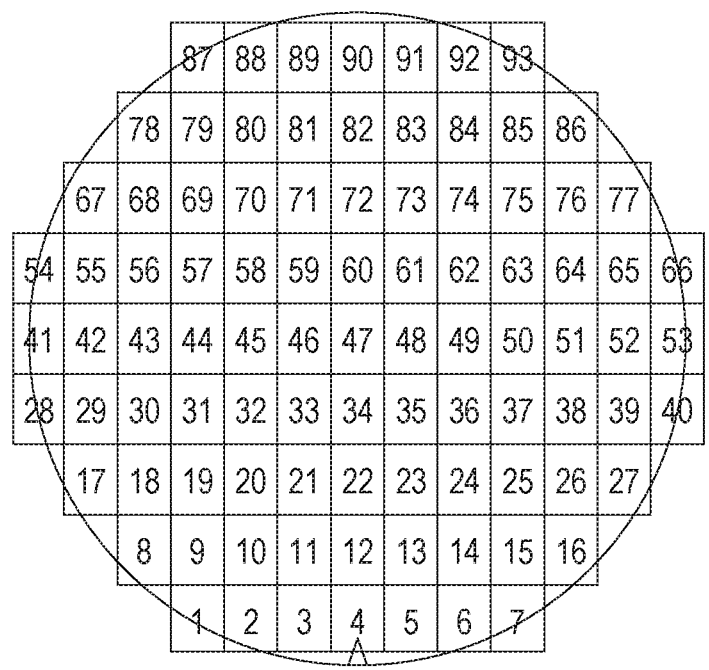
FIG. 10 is a diagram illustrating a shot layout according to a third embodiment.

In a third embodiment described below, the imprint apparatus 100 having functions described in the first embodiment or the second embodiment are used to handle a shot layout such as that shown in FIG. 10. FIG. 10 illustrates a shot layout of shot regions formed on the substrate 2. In the shot layout shown in FIG. 10, numbers assigned to the respective shot regions are ID numbers indicating the locations of the shot regions. Note that the imprinting process does not need to be performed in the order of ID numbers. However, in the initial setting of the imprint apparatus 100 according to the present embodiment, the imprinting process is performed in the order of the ID numbers indicating the locations of the shot regions shown in FIG. 10.

In the imprint apparatus 100, it is known that the gas pressure applied to the imprint head 4 during the imprinting process varies depending on the locations of the shot regions formed on the substrate 2. In general, in shot regions located in a central area of the substrate 2, the distance between the mold 1 and the substrate 2 is constant, and thus, in the imprinting process, the imprint head 4 receives the gas pressure caused by a gas trapped between the mold 1 and substrate 2. On the other hand, in shot regions located in a peripheral area of the substrate 2, there is a space between the substrate 2 and a structure (not shown) located around the substrate chuck 3*a*. Furthermore, there is a difference in height between the surface of the substrate 2 and the surface of the structure. Therefore, the gas pressure caused by air tapped between the mold 1 and the substrate 2 is not as high as in the central area. As a result, the reaction force against the imprint head 4 is smaller than in the central area. Therefore, if the same position imprint profile is used in the imprinting process for both the shot regions in the central area and those in the peripheral area of the substrate 2, a difference occurs in behavior of the imprint head 4 relating to the height in the imprinting process.

In view of the above, in the imprint method according to the present embodiment, gas pressure caused by air trapped between the mold 1 and the substrate 2 or the behavior of the height of the imprint head 4 during the imprinting process are evaluated for each shot region, and shot regions are grouped according to the evaluation result. FIG. 11 shows an example in which the shot regions are divided into a shot region group (Group A) located in the central area of the substrate 2 and a shot region group (Group B) located in the peripheral area.

Next, at least one or more representative shot regions (sample shots) are defined for each of the shot region groups Group A and Group B. The representative shot regions are shot regions in which height information and tilt information are acquired, and/or flatness information relating to the substrate 2 is acquired. It is desirable that among shot regions in each group, the representative shot regions be subjected first to the imprinting process. The controlling unit 11 of the imprint apparatus 100 may perform the imprinting process on shot regions belonging to the same group using a force imprint profile generated from the measurement result for the representative shot region of the group, thereby achieving the imprinting process in the same manner for all shot regions.

Figure 12:
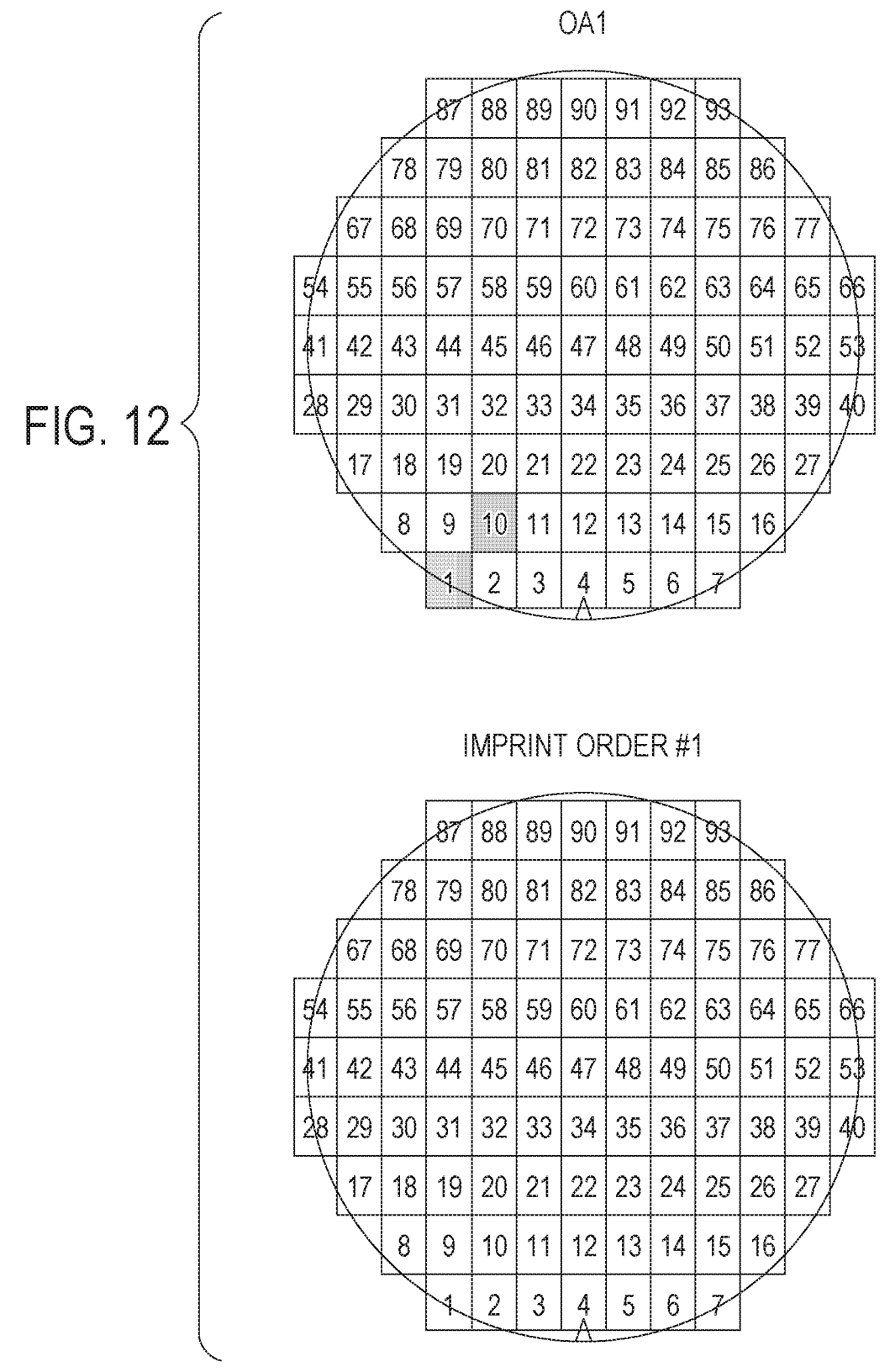

FIG. 12 illustrates an example of a manner in which representative shot regions are set. In an example shown in OA1 in FIG. 12, representative shots are set such that a shot region having a smallest process order number (smallest ID number) in each of the shot region group Group A and the shot region group Group B is assigned as a representative shot. In a case where the representative shot regions are set as in OA1 shown in FIG. 12, it is not necessary to define the order of imprinting process separately from the shot numbers (ID numbers), and it is allowed to perform the imprinting process in the order of shot numbers. Thus, the numbers indicating the imprinting process order shown in Imprint Order #1 in FIG. 12 are the same as ID numbers indicating the locations of the shot regions shown in FIG. 10. However, in this case, it is necessary to measure the two representative shot regions separately from the imprint sequence, which may cause a reduction in throughput (productivity).

To handle the above situation, representative shot regions may be measured using a measurement sequence in a substrate registration process that is executed when the substrate 2 is loaded on the imprint apparatus 100. This makes it possible to perform the measurement without causing a reduction in throughput.

Figure 13:
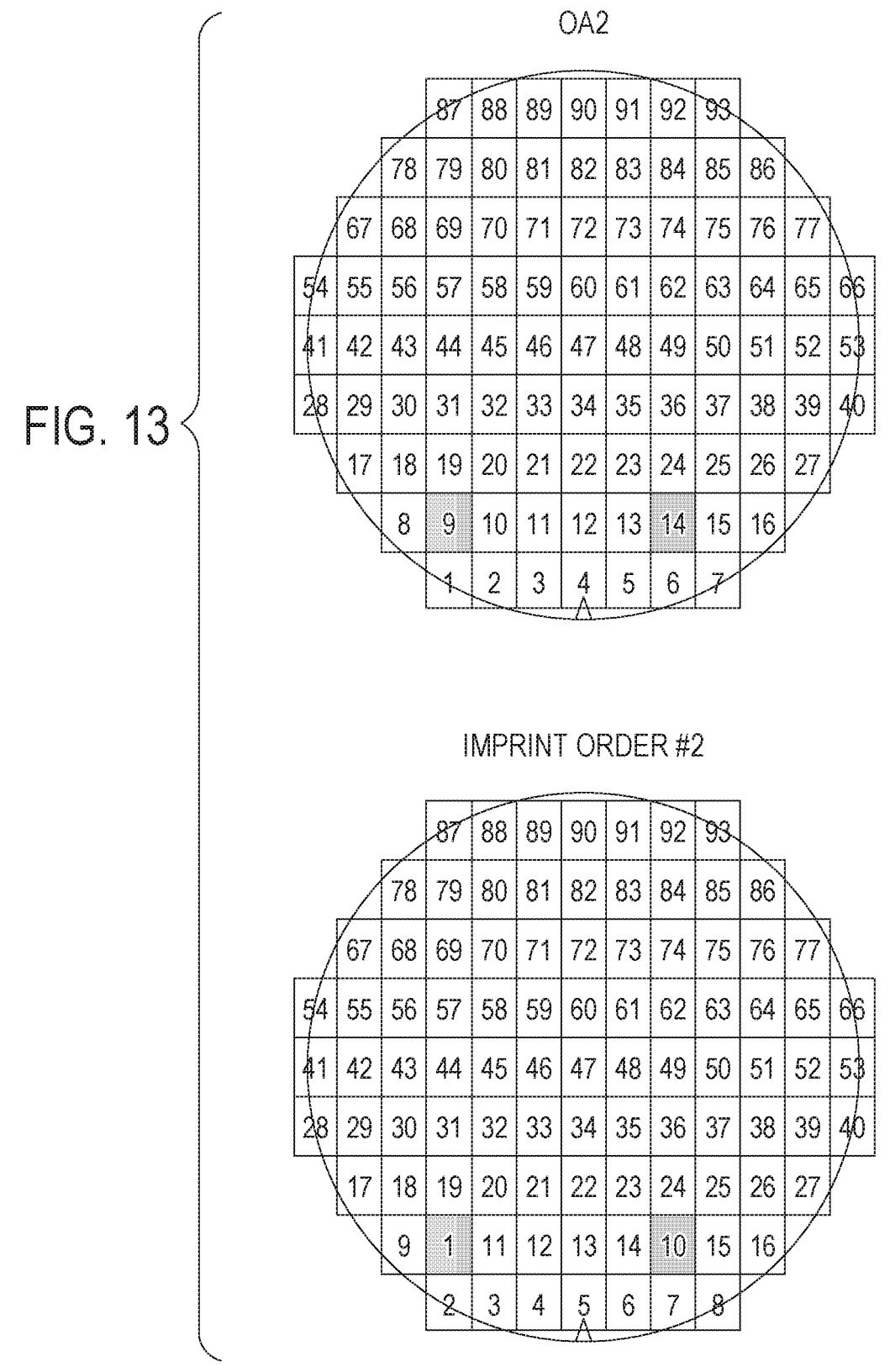

FIG. 13 illustrates an example of a manner of defining representative shot regions. In the example shown in FIG. 13, shot regions at locations apart by a distance large enough to achieve a registration are selected as representative shot regions. The large distance between the representative shot regions makes it possible to precisely correct the rotation error of the substrate 2 in the registration. (OA2). In this case, from the point of view of throughput, the imprinting process order is set (rearranged) such that the moving distance of the substrate stage 3 is minimized as possible, and the imprinting process is performed efficiently (Imprint Order #2).

To increase the imprinting process accuracy, the number of shot region groups may be increased. For example, as shown in FIG. 14, shot regions may be divided into four groups A, B, C, and D. More specifically, in the example shown in FIG. 14, shot regions are divided into four shot region groups depending on the distance from the center of the substrate 2.

Figure 15:
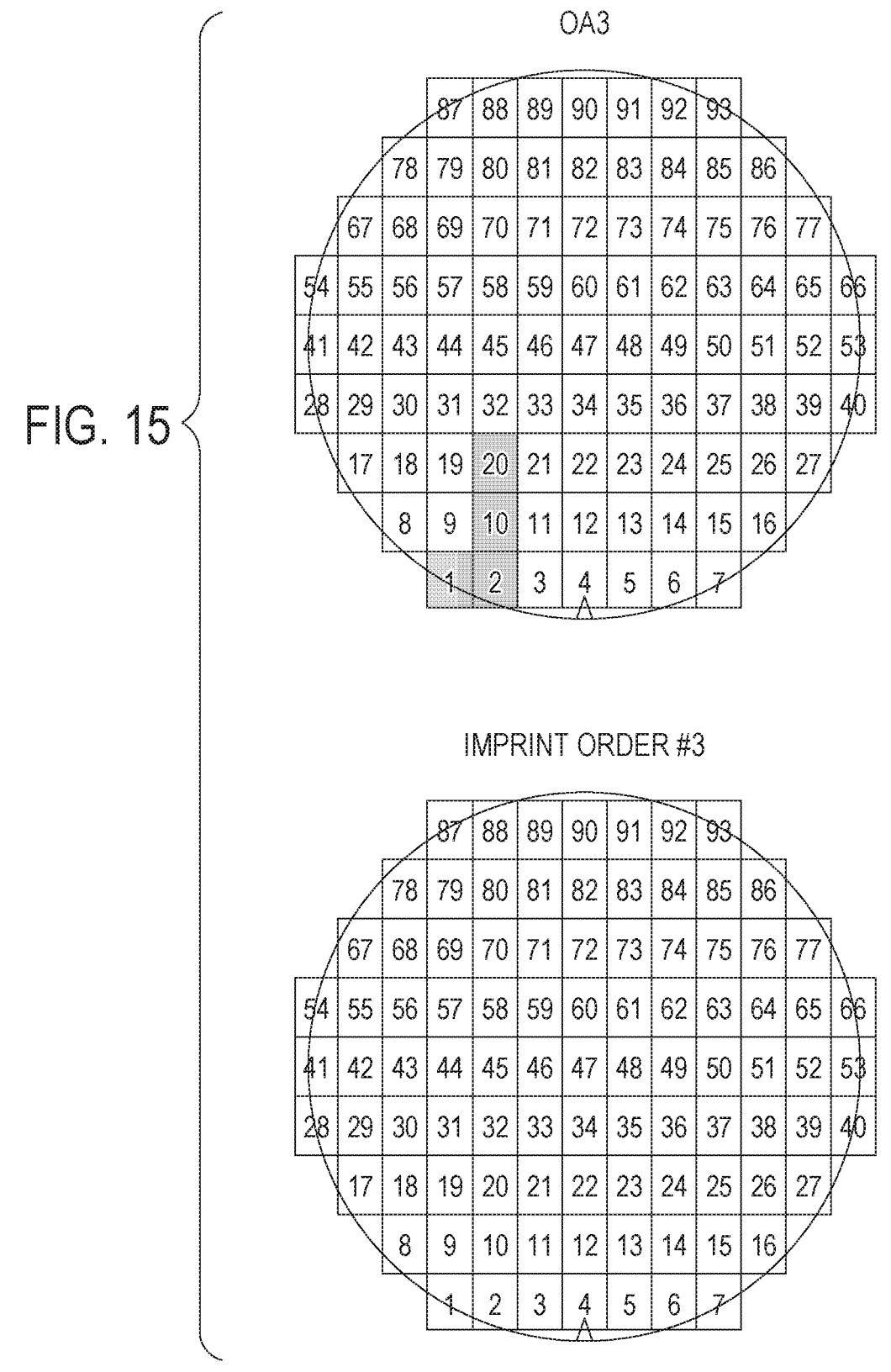

Also in this case, as in the previous case, representative shot regions are assigned in the respective shot region groups, and correspondingly the imprinting process order is defined. In FIG. 15, OA3 shows an example of a manner of assigning representative shot regions for a case where shot regions are divided into Groups A, B, C, and D as shown in FIG. 14. In FIG. 15, Imprint Order #3 shows an example of an imprinting process order defined for the case where shot regions are divided into Groups A, B, C, and D as shown in FIG. 14. A shot region with an ID number of 20 in OA3 in FIG. 15 is assigned as the representative shot region in the Group A in FIG. 14. A shot region with an ID number of 10 in OA3 in FIG. 15 is assigned as the representative shot region in the Group B in FIG. 14. A shot region with an ID number of 2 in OA3 in FIG. 15 is assigned as the representative shot region in the Group C in FIG. 14. A shot region with an ID number of 1 in OA3 in FIG. 15 is assigned as the representative shot region in the Group D in FIG. 14. That is, among shot regions in each shot region group, a smallest imprinting process order number (ID number) is designated. The numbers indicating the imprinting process order shown in Imprint Order #3 in FIG. 15 are the same as ID numbers indicating the locations of the shot regions shown in FIG. 10.

In FIG. 16, OA4 shows an example of a manner of designating representative shot regions for a case where shot regions are grouped as shown in FIG. 14. In this example shown in OA4 in FIG. 16, unlike the example shown in OA3 of FIG. 15, representative shot regions are set so as to precisely correct the rotation error of the substrate 2 by selecting shot regions located apart by a sufficiently large distance as shot regions for use in registration. More specifically, a shot region with an ID number of 16 shown in OA4 in FIG. 16 is selected as a representative shot region of Group C shown in FIG. 14.

In this case, the order of imprinting process is set (rearranged) such that the moving distance of the substrate stage 3 is minimized as possible from the viewpoint of throughput and the imprinting processing is performed efficiently (Imprint Order #4 in FIG. 16).

Figure 17:
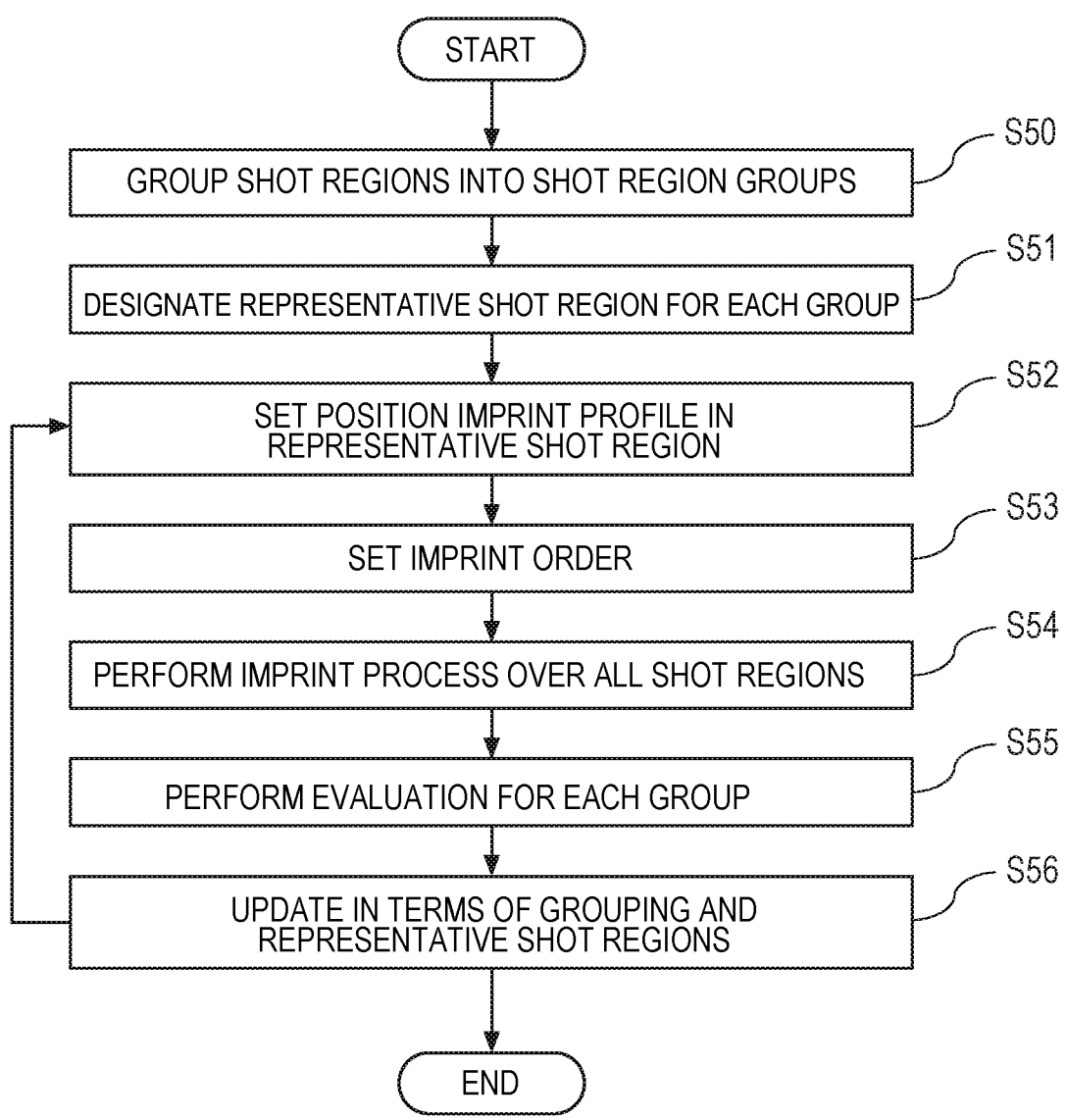
FIG. 17 is a diagram illustrating a flow of updating grouping and representative shot regions according to the third embodiment.

Next, a method of grouping a plurality of shot regions formed on the substrate 2 and setting a representative shot region for evaluation will be described. FIG. 17 is a flow chart illustrating a method of performing grouping for a plurality of shot regions, assigning representative shot regions, and performing evaluations.

In step S50, at the start of the method of evaluating the imprinting process, a plurality of shot regions formed on the substrate 2 are divided into a plurality of shot region groups. For example, the shot regions may be grouped into Group A and Group B as shown in FIG. 11, or the shot regions may be divided into Groups A, B, C, and D as shown in FIG. 14.

In step S51, one or more representative shot regions for measurement are designated for each group formed in step S50. Note that one or more shot regions are designated as the representative shot regions in each group. For example, representative shot regions are designated as necessary depending on the number of groups and the locations of groups as shown in OA1 in FIG. 12, OA2 in FIG. 13, OA3 in FIG. 15, and OA4 in FIG. 16. Then in step S52, a position imprint profile is set for each representative shot region designated in step S51.

In step S53, the imprinting process order is set such that the designated representative shot region of a group is subjected to the imprinting process first among shot regions belong to the group. In this case, from the point of view of throughput, the imprinting process order is set (rearranged) such that the moving distance of the substrate stage 3 is minimized as possible, and the imprinting process is performed efficiently. For example, in a case where representative shot regions are designated as shown in OA1, the imprinting process order may be set as Imprint Order #1 in FIG. 12. In a case where representative shot regions are designated as shown in OA2, the imprinting process order may be set as Imprint Order #2 in FIG. 13. In a case where representative shot regions are designated as shown in OA3, the imprinting process order may be set as Imprint Order #3 in FIG. 15. In a case where representative shot regions are designated as shown in OA4, the imprinting process order may be set as Imprint Order #4 in FIG. 16.

In step S54, when the order of imprinting process is set for all shot regions, the imprinting process is performed for all shot regions formed on the substrate 2. As for the imprinting process for each shot region is performed according to the flow chart shown in FIG. 3.

Thereafter, in step S55, the stability of the process in the shot region group is evaluated from logs which are recorded in the imprinting process in step S54 and which describes the Z position (for example, the Z position of the mold 1 or the imprint head 4) in the imprinting process for each shot region. The stability in the group is evaluated by the maximum value (Max value) or RMS value of the difference from the assumed position imprint profile (reference Z position profile). A shot region that is the smallest in difference from the assumed profile is used as the next representative shot region. As described above, in step S56, the representative shot region to be designated for a next and subsequent substrates is updated based on the result of the evaluation of the stability of the imprinting process within the group. After the representative shot regions are updated, the processing flow returns to step S52 in which the imprinting process is performed on the substrate to be imprinted next.

In the above description, it is assumed by way of example that the imprinting process is evaluated for each substrate, and representative shot regions are updated. However, instead of evaluating the imprinting process on a substrate-by-substrate basis, the imprinting process may be evaluated on a lot-by-lot basis, or the evaluation may be made based on statistical data obtained via monitoring for an arbitrary time, and the representative shots may be updated based on the evaluation result. In a case where the maximum difference value from the above-described profile or the RMS value exceeds a predetermined allowable value (a threshold value), a warning may be issued. In step S56, the grouping may be updated based on the result of evaluation of the measurement in each shot region such that shot regions having similar evaluation results are grouped in the same group. In addition to the above-described evolution methods, various methods can be used to evaluate the imprinting process. For example, the average profile of the shot regions in the group may be employed as the reference.

The series of steps shown in FIG. 17, including the step of dividing shot regions into a plurality of shot region groups, the step of designating a representative shot region, and the step of regrouping the shot regions and reassigning representative shot regions based on evaluation results, may be controlled by the controlling unit 11 of the imprint apparatus 100. The designation of representative shot regions and the setting of the imprinting process order may be performed manually or automatically by the imprint apparatus according to the rule described above. Furthermore, the imprint apparatus 100 may establish the rule of regrouping shot regions, predesignating representative shot regions, and the like, and may perform such operations automatically according to the rule.

FIG. 18 is a table showing an example of setting finally assigned to the ID number indicating the position of each shot region for the shot layout shown in FIG. 10. In the table shown in FIG. 18, description of some shot regions is omitted. From the leftmost to the rightmost in the table shown in FIG. 18, are described the shot region ID number (#Shot), the assigned shot region group (Group), and the representative shot region in which the height measurement is performed in advance for each group. In the example shown in FIG. 18, the height is measured in advance in the shot region with the ID number of 1 for determining the height for Group A, and the height is measured in advance in the shot region with the ID number of j for determining the height for Group B. That is, the locations of the representative shot regions are indicated.

Furthermore, FIG. 18 shows the type of the profile (designated profile) assigned to each shot region. Normally, a position imprint profile in the height direction is set for the representative shot region. For example, the position imprint profile $Z(1)$ is set for the shot region with the ID number 1, and the position imprint profile $Z(j)$ is set for the shot region with the ID number j. For the other shot regions included in the same group (for example, Group A), the force imprint profile $F(1)$ generated after imprinting by using the position imprint profile $Z(1)$ is set.

Furthermore, FIG. 18 also shows numbers (#Order) indicating the imprinting process order set in the respective shot regions. As described above, the imprinting process order is determined so as to achieve high efficiency in terms of throughput, and thus the ID number of the shot region and the imprinting process order do not always match. Although not shown in the table in FIG. 18, profiles may be set for the above-described tilt control and moment control by controlling plurality of actuators (for example, 3-axis actuators). Furthermore, it is possible to automatically set the tilt control and the moment control according to a rule established beforehand.

In the above-described imprint apparatus 100, it is assumed by way of example that the imprint material is cured using the photo-curing method. However, in the present embodiment, the curing is not limited to the photo-curing method. For example, the imprint material may be cured using heat. In the photo-curing method, an ultraviolet curable resin is used. The resin is cured by irradiating with ultraviolet light in a state where the mold is pressed against the substrate 2 through the resin. Then, the mold is separated from the cured resin. As a result, a pattern of the cured resin is obtained. In the present embodiment, ultraviolet light is used as the curing light. However, the wavelength of the light may be determined as necessary depending on the imprint material supplied onto the substrate 2. On the other hand, in the method using heat, a thermoplastic resin is heated to a temperature equal to or higher than a glass transition temperature such that a flowability of the resin is enhanced. In this state, the mold is pressed against the substrate 2 via the resin. After the resin is cooled, the mold is separated from the resin. As a result, a pattern of the resin is obtained.

[Method of Manufacturing Article]

The pattern of the cured material formed using the imprint apparatus may be used permanently as at least a part of various articles, or may be used temporarily in the middle of manufacturing of various articles. Examples of articles include electronic circuit elements, optical elements, MEMSs, recording elements, sensors, molds, and the like. Examples of electronic circuit elements include volatile or non-volatile semiconductor memories such as DRAMs, SRAMs, flash memories, and MRAMs, and semiconductor devices such as LSIs, CCDs, image sensors, FPGAs, and the like. Examples of molds include molds for imprinting.

The pattern of the cured material may be used as it is, as at least a part of constituent element of one of the above-described articles, or may be temporarily used as a resist mask. In a case where the pattern of the cured material is used as a resist mask in a substrate fabrication process in which a substrate is processed, the resist mask is removed after etching, ion implantation, or the like is performed. The substrate fabrication process may include etching, resist removal, dicing, bonding, packaging, and the like.

Figure 19A:
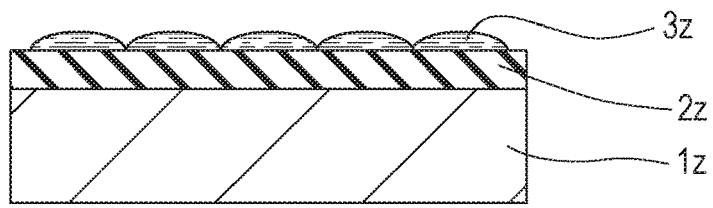
FIGS. 19A, 19B, 19C, 19D, 19E, and 19F are diagrams illustrating a method of manufacturing an article.

Next, a specific method for manufacturing an article is described below. Referring to FIG. 19A, a substrate 1z such as a silicon wafer having a material 2z such as an insulator to be processed is formed on a surface of the substrate 1z is prepared. Using an ink-jet method or the like, an imprint material 3z is applied to the surface of the material 2z to be processed. In the example shown in FIG. 19A, the imprint material 3z in the form of a plurality of droplets is applied to the substrate 1z.

Figure 19B:
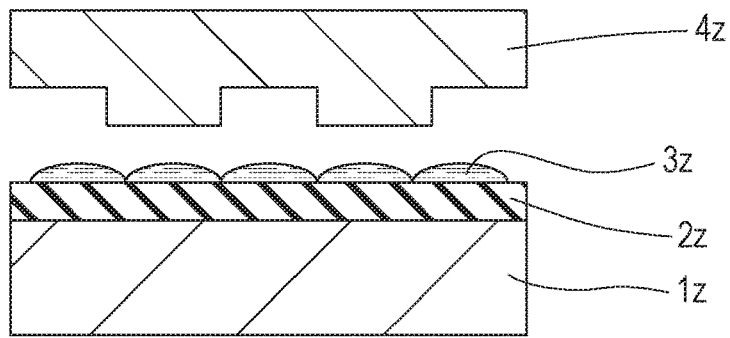
Figure 19C:
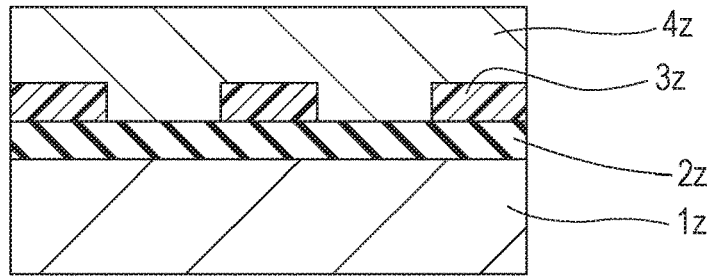

Referring to FIG. 19B, an imprinting mold 4z is placed so as to oppose the substrate 1z such that a side on which uneven pattern is formed faces the imprinting material 3z on the substrate 1z. Thereafter, as shown in FIG. 19C, the substrate 1z provided with the imprint material 3z thereon and the mold 4z are brought into contact with each other and a pressure is applied. The imprint material 3z is filled in the space between the mold 4z and the material 2z to be processed. In this state, the imprint material 3z is irradiated with light as the curing energy via the mold 4z thereby curing the imprint material 3z.

Figure 19D:
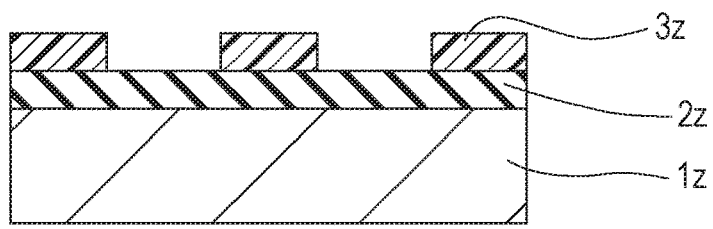

After the imprint material 3z is cured, the mold 4z and the substrate 1z are separated from each. As a result, a pattern of a cured imprint material 3z is formed on the substrate 1z, as shown in FIG. 19D. The resultant pattern of the cured material has a shape in which the concave portions of the mold 4z correspond to the convex portions of the cured material, and the convex portions of the mold 4z correspond to the concave portions of the cured material. That is, the concave-convex pattern of the mold 4z is transferred to the imprint material 3z.

Figure 19E:
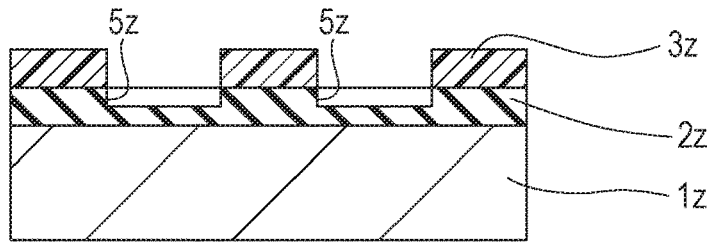
Figure 19F:
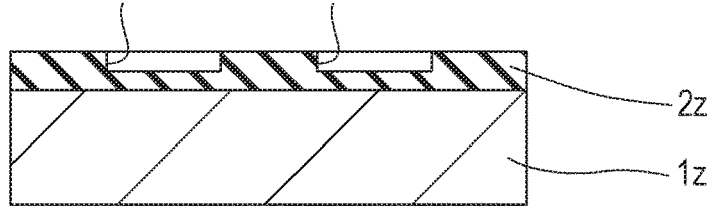

Referring to FIG. 19E, the material 2z to be processed is etched using the pattern of the cured material as an etching mask. As a result, surface parts of the material 2z, which are not covered with the cured material or covered with a thin residual cured material, are removed, and grooves 5z are formed. Referring to FIG. 19F, when the pattern of the cured material is removed, an article having grooves 5z formed on the surface of the material 2z to be processed is obtained. Although the pattern of the cured material is removed in the present example, the pattern of the cured material may be maintained without being removed. For example, the remaining cured material may be used as an interlayer insulating film included in a semiconductor device or the like. That is, the remaining cured material may be used as a constituent element of an article. The article manufacturing method according to the present embodiment is advantageous for at least one of the performance, quality, productivity, and production cost of an article as compared with the conventional method.

The present invention provides the imprint apparatus capable of setting an imprint control parameter suitable for each of a plurality of different shot regions on a substrate.

The present invention has been described above with reference to embodiments. Note that the present invention is not limited to these embodiments, and various modifications and changes can be made within the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-136289, filed Jul. 24, 2019, and Japanese Patent Application No. 2019-203427, filed Nov. 8, 2019, which are hereby incorporated by reference herein in their entirety.

What is claimed is:

1. An imprint apparatus configured to form a pattern of an imprint material on a substrate using a mold, comprising:
   an imprint head including an actuator for moving the mold;
   a force sensor configured to detect force generated by the actuator;
   a position sensor configured to measure a position of the mold;
   a memory storing instructions; and
   a processor which is capable of executing the instructions to control the imprint head according to a selected imprint profile of a force imprint profile and a position imprint profile, the force imprint profile being defined for controlling the movement of the mold based on force generated by the actuator and detected by the force sensor, the position imprint profile being defined for controlling the movement of the mold based on the position of the mold measured by the position sensor, and
   either the force imprint profile or the position imprint profile is selectable when the mold is brought into contact with the imprint material on the substrate.

2. The imprint apparatus according to claim 1, wherein the position of the mold is a height of the mold.

3. The imprint apparatus according to claim 1, wherein, when the pattern of the imprint material is formed on the substrate by controlling the imprint head according to the force imprint profile, the processor executes the instructions to measure a position of the mold using the position sensor.

4. The imprint apparatus according to claim 3, wherein the position imprint profile is generated from a result of the measurement of the position of the mold by the position sensor.

5. The imprint apparatus according to claim 1, wherein, when the pattern of the imprint material is formed on the substrate by controlling the imprint head according to the position imprint profile, the processor executes the instructions to detect a force generated by the actuator using the force sensor.

6. The imprint apparatus according to claim 5, wherein the force imprint profile is generated from a result of a detection, by the force sensor, of a force generated by the actuator.

7. The imprint apparatus according to claim 1, wherein the position imprint profile is a profile obtained by correcting a reference position imprint profile stored in advance in the memory based on a result of measurement of positions of a substrate and a mold carried in the imprint apparatus.

8. The imprint apparatus according to claim 1, wherein the imprint head includes a plurality of actuators, and based on information indicating a relative tilt that occurs between the mold and the substrate when the mold and the imprint material on the substrate come into contact with each other, the processor executes the instructions to control the plurality of actuators thereby adjusting the tilt of the mold to form the pattern of the imprint material on the substrate.

9. The imprint apparatus according to claim 1, wherein
a plurality of shot regions in which a pattern of an imprint material is to be formed are formed on the substrate, and
the force imprint profile or the position imprint profile is selected depending on the location of a shot region.

10. An imprint apparatus configured to form a pattern of an imprint material on a substrate using a mold, comprising:
an imprint head including an actuator for moving the mold;
a force sensor configured to detect force generated by the actuator;
a position sensor configured to measure a position of the mold;
a memory storing instructions; and
a processor which is capable of executing the instructions to control the imprint head according to a force imprint profile or a position imprint profile, the force imprint profile being defined for controlling the movement of the mold based on force generated by the actuator and detected by the force sensor, the position imprint profile being defined for controlling the movement of the mold based on the position of the mold measured by the position sensor,
a plurality of shot regions in which a pattern of an imprint material is to be formed are formed on the substrate,
the force imprint profile or the position imprint profile is selected depending on the location of a shot region,
the plurality of shot regions are divided into a plurality of groups, and
the processor executes the instructions to form a pattern in a plurality of shot regions included in each group according to a force imprint profile or a position imprint profile generated based on a result of forming the pattern in a representative shot region designated in advance for the group.

11. The imprint apparatus according to claim 10, wherein the representative shot region is designated for each of the plurality of groups.

12. The imprint apparatus according to claim 11, wherein each representative shot region belongs to one of the plurality of groups and is subjected to the process of forming the pattern of the imprint material using the mold first among all shot regions belonging to the one of the plurality of groups.

13. The imprint apparatus according to claim 12, wherein
the processor executes the instructions to acquire a force imprint profile generated when a pattern of an imprint material is formed in the representative shot region by controlling the imprint head according to the position imprint profile, and
the processor executes the instructions to form a pattern of an imprint material in a shot region in a group in which the representative shot region is included by controlling the imprint head according to the acquired force imprint profile.

14. The imprint apparatus according to claim 10, wherein
the processor executes the instructions to acquire height information related to the representative shot region before the pattern of the imprint material is formed on the substrate, and
the processor executes the instructions to control the imprint head according to the position imprint profile generated based on the height information.

15. An article manufacturing method comprising:
forming a pattern of an imprint material on a substrate using the imprint apparatus according to claim 1, and
processing the substrate on which the pattern of the imprint material is formed in the forming.

* * * * *